(12) United States Patent
Kim et al.

(10) Patent No.: US 12,288,526 B2
(45) Date of Patent: Apr. 29, 2025

(54) ELECTRONIC DEVICE

(71) Applicant: Samsung Display Co., Ltd., Yongin-si (KR)

(72) Inventors: Sunho Kim, Seongnam-si (KR); Gun Hee Kim, Seoul (KR); Taehoon Yang, Yongin-si (KR); Sun Hee Lee, Hwaseong-si (KR); Sungjin Hong, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/094,384

(22) Filed: Jan. 8, 2023

(65) Prior Publication Data

US 2023/0162687 A1    May 25, 2023

Related U.S. Application Data

(63) Continuation of application No. 17/499,820, filed on Oct. 12, 2021, now Pat. No. 11,551,618.

(30) Foreign Application Priority Data

Dec. 24, 2020 (KR) .......................... 10-2020-0183627

(51) Int. Cl.
*G09G 3/3266* (2016.01)
*G09G 3/3275* (2016.01)

(52) U.S. Cl.
CPC ......... *G09G 3/3266* (2013.01); *G09G 3/3275* (2013.01); *G09G 2380/02* (2013.01)

(58) Field of Classification Search
CPC ....... H10K 59/131; H10K 59/12; G09F 9/301
See application file for complete search history.

(56) References Cited

U.S. PATENT DOCUMENTS

| 9,293,102 B1 | 3/2016 | Chiu et al. |
| 10,448,513 B2 | 10/2019 | Kim |
| 10,991,315 B2 | 4/2021 | Li et al. |

(Continued)

FOREIGN PATENT DOCUMENTS

| CN | 109541865 | 3/2019 |
| KR | 1020170046748 A | 5/2017 |

(Continued)

OTHER PUBLICATIONS

Non-Final Office Action mailed Mar. 30, 2022, in U.S. Appl. No. 17/499,820.

(Continued)

*Primary Examiner* — Robin J Mishler
*Assistant Examiner* — Amen W Bogale
(74) *Attorney, Agent, or Firm* — CANTOR COLBURN LLP

(57) ABSTRACT

An electronic device including a display panel, a scan driving circuit, and a data driving circuit. The display panel includes a plurality of scan lines, a plurality of data lines, and a plurality of pixels. The scan driving circuit is configured to apply a scan signal to the scan lines. The data driving circuit is configured to apply a data signal to the data lines. The scan lines extend in a first direction. The scan driving circuit and the data driving circuit are arranged in the first direction.

19 Claims, 17 Drawing Sheets

(56) References Cited

U.S. PATENT DOCUMENTS

| | | | |
|---|---|---|---|
| 2005/0140642 A1* | 6/2005 | Chiu | G09G 3/20 345/103 |
| 2010/0295764 A1 | 11/2010 | Wang et al. | |
| 2011/0234568 A1* | 9/2011 | Izumida | H01L 27/124 345/211 |
| 2014/0152646 A1* | 6/2014 | Kang | H10K 59/80 29/829 |
| 2015/0310801 A1* | 10/2015 | Lin | H10K 59/123 345/205 |
| 2016/0118420 A1 | 4/2016 | Yang et al. | |
| 2017/0025070 A1 | 1/2017 | Kang et al. | |
| 2017/0123506 A1 | 5/2017 | Song et al. | |
| 2017/0358258 A1* | 12/2017 | Kim | G09G 3/3225 |
| 2018/0122329 A1* | 5/2018 | Chen | G09G 5/003 |
| 2018/0197484 A1* | 7/2018 | Moon | H01L 27/12 |
| 2018/0204895 A1* | 7/2018 | Lin | H10K 59/131 |
| 2019/0206976 A1 | 7/2019 | Jeong et al. | |
| 2019/0250479 A1 | 8/2019 | Yeh | |
| 2019/0252411 A1* | 8/2019 | Lee | H01L 27/124 |
| 2019/0278145 A1* | 9/2019 | Tanaka | G02F 1/136286 |
| 2021/0134907 A1 | 5/2021 | Kim et al. | |
| 2022/0077275 A1 | 3/2022 | Jo et al. | |
| 2022/0189410 A1* | 6/2022 | Kim | H10K 59/131 |

FOREIGN PATENT DOCUMENTS

| | | |
|---|---|---|
| KR | 1020170080233 A | 7/2017 |
| KR | 10-2017-0106553 | 9/2017 |
| KR | 1020170139215 A | 12/2017 |

OTHER PUBLICATIONS

Notice of Allowance issued Sep. 9, 2022, in U.S. Appl. No. 17/499,820.

* cited by examiner

ELECTRONIC DEVICE

CROSS-REFERENCE TO RELATED APPLICATIONS

This application is a Continuation of U.S. patent application Ser. No. 17/499,820, filed on Oct. 12, 2021, which claims priority to and the benefit of Korean Patent Application No. 10-2020-0183627, filed Dec. 24, 2020, each of which is hereby incorporated by reference for all purposes as if fully set forth herein.

BACKGROUND

Field

One or more embodiments generally relate to an electronic device with improved display quality.

Discussion

An electronic device displays a variety of images through a display screen to provide a user with information. In general, an electronic device displays information via a display screen allocated thereto. Flexible electronic devices including a flexible display panel that is at least foldable are being developed. Different from a rigid electronic device, a flexible electronic device may be folded, rolled, bent, and/or the like. Since the shape of a flexible electronic device can be changed in various ways, carrying a flexible electronic device regardless of its original screen size is easier, and thus, user convenience is improved.

The above information disclosed in this section is only for understanding the background of the inventive concepts, and, therefore, may contain information that does not form prior art.

SUMMARY

Various embodiments are capable of providing an electronic device with improved display quality.

Additional aspects will be set forth in the detailed description which follows, and, in part, will be apparent from the disclosure, or may be learned by practice of the inventive concepts.

According to an embodiment, an electronic device includes a display panel, a scan driving circuit, and a data driving circuit. The display panel includes a plurality of scan lines, a plurality of data lines, and a plurality of pixels. The scan driving circuit is configured to apply a scan signal to the scan lines. The data driving circuit is configured to apply a data signal to the data lines. The scan lines extend in a first direction. The scan driving circuit and the data driving circuit are arranged in the first direction.

The display panel includes a first panel area, a bending area, and a second panel area, which are defined therein along the first direction, the scan driving circuit is disposed in the first panel area, and the data driving circuit is provided in a driving chip form and is electrically connected to the display panel via the second panel area.

The display panel further includes a plurality of fan-out lines electrically connecting the data lines and the data driving circuit, and a portion of each of the fan-out lines overlaps the scan driving circuit.

The data lines include a plurality of first data lines and a plurality of second data lines, the first data lines are electrically connected to the second data lines, respectively, the first data lines extend in the first direction, and the second data lines extend in a second direction crossing the first direction.

The first data lines are electrically connected to the fan-out lines, respectively, and the first data lines extend from the fan-out lines, respectively.

The first data lines are electrically connected to the fan-out lines, respectively, and the first data lines are disposed on a layer different from a layer on which the fan-out lines are disposed.

A length of one first data line among the first data lines is longer than a length of another first data line among the first data lines, and a length of one fan-out line connected to the one first data line is shorter than a length of another fan-out line connected to the another first data line.

The display panel further includes a plurality of dummy lines, the dummy lines respectively face the first data lines, and each of the dummy lines extends in the first direction.

The display panel further includes a plurality of shielding lines, and each of the shielding lines overlap one dummy line among the dummy lines and one first data line among the first data lines.

Each of the pixels includes a pixel circuit and a light emitting element, the light emitting element includes a first electrode, a light emitting layer disposed on the first electrode, and a second electrode disposed on the light emitting layer to receive a common voltage, and the display panel includes a display area in which the light emitting element is disposed and a non-display area defined adjacent to the display area.

The display panel further includes an auxiliary pattern receiving the common voltage, the auxiliary pattern is disposed on a same layer as the fan-out lines, and the auxiliary pattern is disposed in the display area.

The auxiliary pattern has a mesh structure.

The display area includes a first display area, a second display area, and a third display area, the pixels include a plurality of first pixels, a plurality of second pixels, and a plurality of third pixels, each of the first pixels includes a first pixel circuit and a first light emitting element, each of the second pixels includes a second pixel circuit and a second light emitting element, each of the third pixels includes a third pixel circuit and a third light emitting element, the first pixel circuit and the first light emitting element are disposed in the first display area, the second pixel circuit, the second light emitting element, and the third pixel circuit are disposed in the second display area, and the third light emitting element is disposed in the third display area.

The scan driving circuit overlaps the third display area.

The display panel is folded and unfolded about a folding axis extending in a second direction crossing the first direction.

According to an embodiment, an electronic device includes a display panel, a scan driving circuit, and a data driving circuit. The display panel includes a plurality of scan lines, a plurality of data lines, a plurality of fan-out lines, and a plurality of pixels. The scan driving circuit is configured to apply a scan signal to the plurality of scan lines. The data driving circuit is configured to apply a data signal to the plurality of data lines via the plurality of fan-out lines. The plurality of fan-out lines overlap the scan driving circuit.

The data lines include a plurality of first data lines and a plurality of second data lines, the first data lines are electrically connected to the second data lines, respectively, the first data lines extend in the first direction, the second data lines extend in a second direction crossing the first direction, a length of one first data line among the first data lines is longer than a length of another first data line among the first data lines, and a length of one fan-out line connected to the one first data line is shorter than a length of another fan-out line connected to the another first data line.

The first data lines are electrically connected to the fan-out lines, respectively, and the first data lines extend from the fan-out lines, respectively.

The first data lines are electrically connected to the fan-out lines, respectively, and the first data lines are disposed on a layer different from a layer on which the fan-out lines are disposed.

The display panel further includes a plurality of dummy lines, the dummy lines respectively face the first data lines, and each of the dummy lines extends in the first direction.

The display panel further includes an auxiliary pattern receiving a common voltage, the auxiliary pattern is disposed on a same layer as the fan-out lines, and the auxiliary pattern has a mesh structure.

The display panel includes a display area through which an image is displayed and a non-display area defined adjacent to the display area, and the scan driving circuit overlaps the display area.

According to one or more embodiments, a direction along which a user scrolls the most frequently can be made the same as an arrangement direction of scan lines of an electronic device. In this manner, even though a user may scroll a screen of the electronic device, defects caused by overlapping new data and previous data may be minimized or at least reduced. Accordingly, display quality of the electronic device may be improved.

According to one or more embodiments, as a display area extends to a portion of a display panel where a scan driving circuit is disposed, a ratio of the display area to a total area of the display panel increases. Accordingly, an electronic device with increased display area and reduced bezel area may be provided.

The foregoing general description and the following detailed description are illustrative and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts. In the drawings.

DETAILED DESCRIPTION OF SOME EMBODIMENTS

Figure 1A:
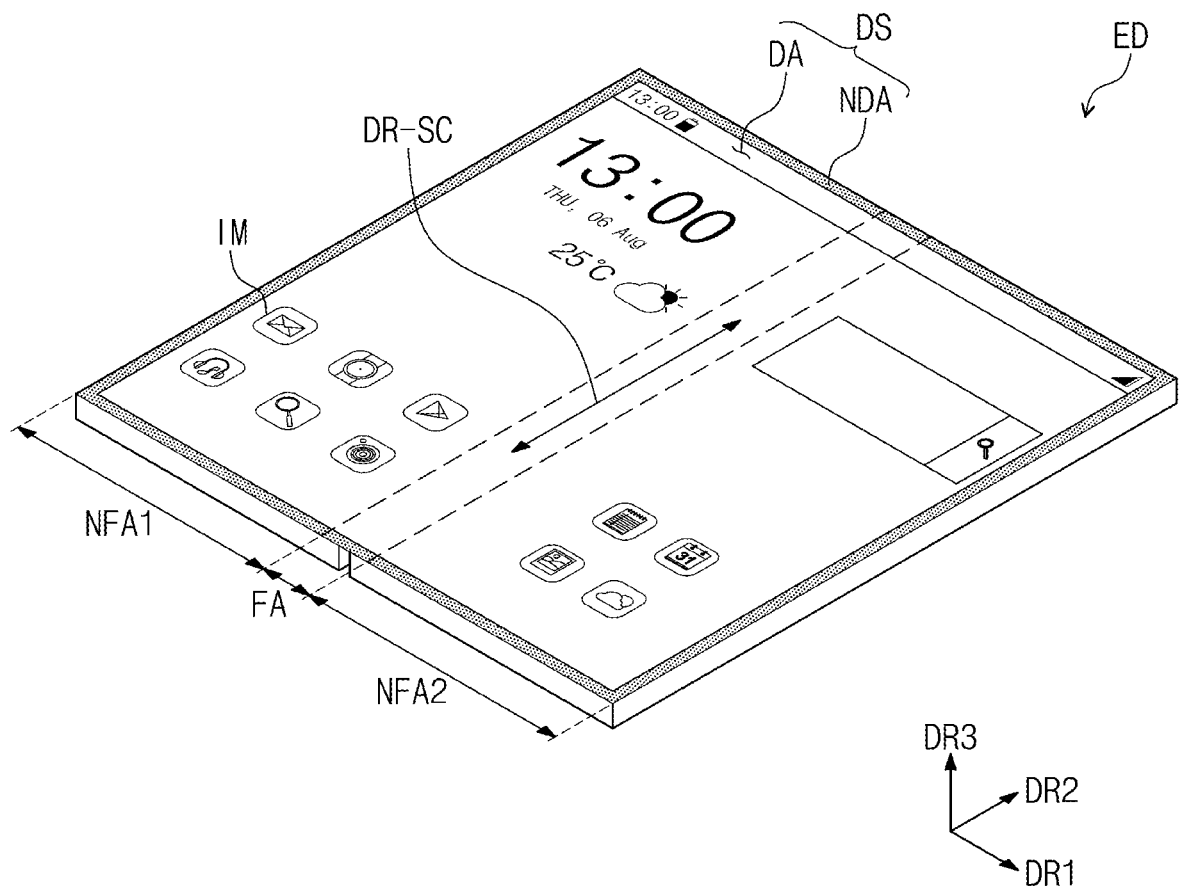
FIGS. 1A and 1B are perspective views showing an electronic device according to an embodiment.

In the following description, for the purposes of explanation, numerous specific details are set forth to provide a thorough understanding of various embodiments. As used herein, the terms "embodiments" and "implementations" may be used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. It is noted that the DR1-axis, the DR2-axis, and the DR3-axis may also be referred to as a first direction DR1, a second direction DR2, and a third direction DR3, respectively. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

Figure 1B:
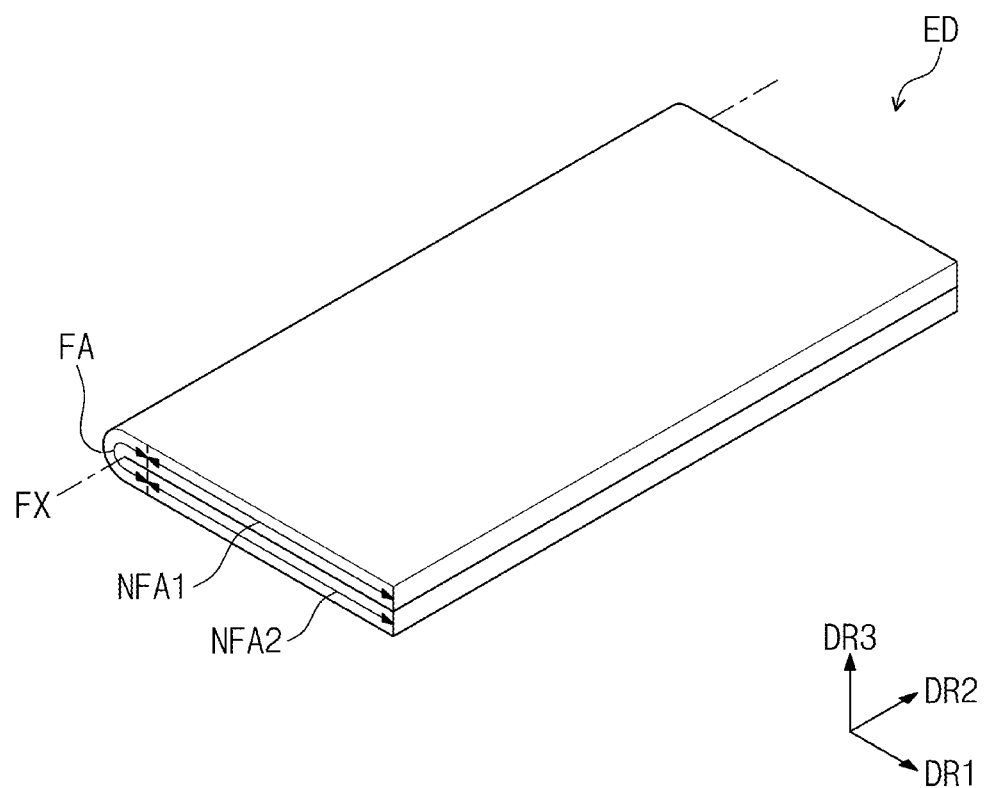

FIGS. 1A and 1B are perspective views showing an electronic device ED according to an embodiment.

FIG. 1A shows the electronic device ED in an unfolded state, and FIG. 1B shows the electronic device ED in a folded state.

Referring to FIGS. 1A and 1B, the electronic device ED may include a display surface DS defined by a first direction DR1 and a second direction DR2 crossing the first direction DR1. The electronic device ED may provide an image IM to a user through the display surface DS.

The electronic device ED may include a display area DA and a non-display area NDA around the display area DA. The image IM may be displayed through the display area DA and may not be displayed through the non-display area NDA. The non-display area NDA may surround the display area DA; however, embodiments are not limited thereto or thereby, and the shape of the display area DA and the shape of the non-display area NDA may be changed.

Hereinafter, a direction substantially perpendicular to a plane defined by the first direction DR1 and the second direction DR2 may be referred to as a third direction DR3. For the purposes of this disclosure, the expression "when viewed in (or on) a plane" may mean a state of being viewed in the third direction DR3. Hereinafter, the first, second, and third directions DR1, DR2, and DR3 are indicated by first, second, and third directional axes, respectively, and are assigned with the same reference numerals as those of the first, second, and third directional axes.

The electronic device ED may include a folding area FA and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The folding area FA may be referred to as a foldable area FA. The non-folding areas NFA1 and NFA2 may be referred to as non-foldable areas NFA1 and NFA2.

As shown in FIG. 1B, the folding area FA may be folded about a folding axis FX substantially parallel to the second direction DR2. The folding area FA may have a predetermined curvature and a radius of curvature. The electronic device ED may be inwardly folded (e.g., inner-folding) such that the first non-folding area NFA1 and the second non-folding area NFA2 may face each other and the display surface DS may not be exposed to the outside.

According to an embodiment, the electronic device ED may be outwardly folded (e.g., outer-folding) such that the display surface DS may be exposed to the outside. According to an embodiment, the electronic device ED may be configured to repeatedly perform the inner-folding operation and/or the outer-folding operation with an unfolding operation. According to an embodiment, the electronic device ED may be configured to selectively perform the unfolding operation, the inner-folding operation, and the outer-folding operation.

Figure 2:
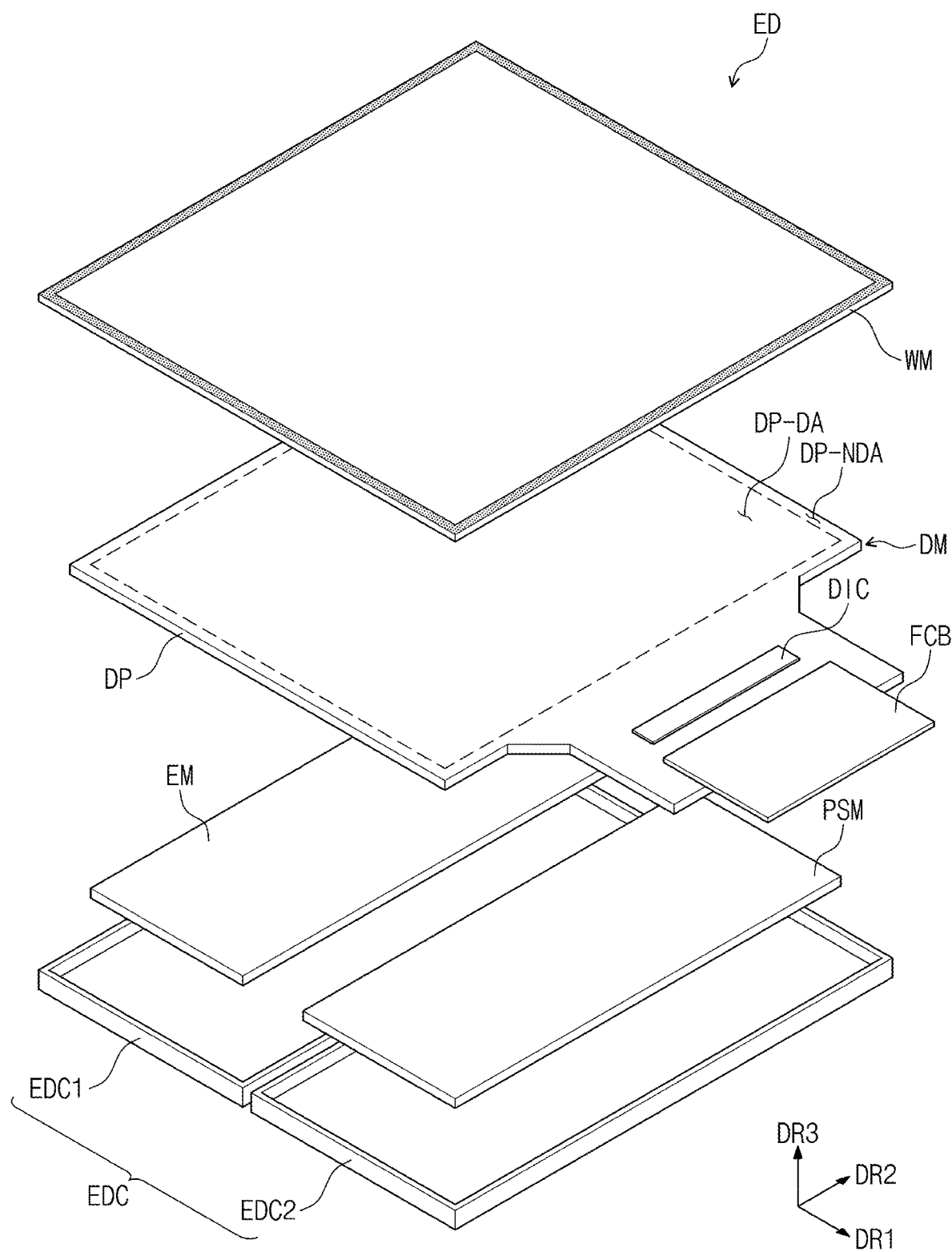
FIG. 2 is an exploded perspective view showing an electronic device according to an embodiment.

FIG. 2 is an exploded perspective view showing the electronic device ED according to an embodiment.

Referring to FIG. 2, the electronic device ED may include a window module WM, a display module DM, an electronic module EM, a power module PSM, and a case EDC. The electronic device ED may further include a mechanical structure to control a folding operation thereof.

The window module WM may provide a front surface of the electronic device ED. The window module WM may include a thin film glass substrate, a plastic film disposed on the thin film glass substrate, and an adhesive layer attaching the thin film glass substrate to the plastic film.

The thin film glass substrate may be a chemically strengthened glass. As the thin film glass substrate is applied, the occurrence of creases may be reduced even though the window module WM is repeatedly folded and unfolded. In an embodiment, a synthetic resin film may be applied to the window module WM instead of the thin film glass substrate. The plastic film may include at least one of polyimide, polycarbonate, polyamide, triacetylcellulose, polymethylmethacrylate, and polyethylene terephthalate. At least one of a hard coating layer, an anti-fingerprint layer, and an anti-reflective layer may be disposed on an upper surface of the plastic film.

The display module DM may include a display panel DP, a driving chip DIC, and a flexible circuit film FCB.

The display panel DP may include a display area DP-DA and a non-display area DP-NDA, which may respectively correspond to the display area DA (refer to FIG. 1A) and the non-display area NDA (refer to FIG. 1A) of the electronic device ED. For the purposes of this disclosure, the expression "an area/portion corresponds to another area/portion" means that "an area/portion overlaps another area/portion," and the "areas and portions" should not be limited to having the same size as each other.

The driving chip DIC may be disposed in the non-display area DP-NDA of the display panel DP. The flexible circuit film FCB may be coupled with the non-display area DP-NDA of the display panel DP. The driving chip DIC may include driving elements to drive pixels of the display panel DP, e.g., a data driving circuit. FIG. 2 shows a structure in which the driving chip DIC is mounted on the display panel DP; however, embodiments are not limited thereto or thereby. For example, the driving chip DIC may be mounted on the flexible circuit film FCB.

The electronic module EM and the power module PSM may be disposed under the display panel DP. The electronic module EM may include at least a main controller. The electronic module EM may include at least one of a wireless communication module, a camera module, a proximity sensor module, an image input module, an audio input module, an audio output module, a memory, an external interface module, and the like. The electronic module EM may be electrically connected to the power module PSM.

The main controller may control an overall operation of the electronic device ED. For example, the main controller may activate or deactivate the display module DM to match a user's input. The main controller may control operations of the display module DM and other modules. The main controller may include at least one microprocessor.

The case EDC may accommodate the display module DM, the electronic module EM, and the power module PSM. The case EDC may include two cases EDC1 and EDC2 separated from each other; however, embodiments are not limited thereto or thereby. The electronic device ED may further include a hinge structure to connect the two cases EDC1 and EDC2 to each other. The cases EDC1 and EDC2 may be coupled with the window module WM. The cases EDC1 and EDC2 may protect the display module DM, the electronic module EM, and the power module PSM, which are accommodated in the cases EDC1 and EDC2.

Figure 3:
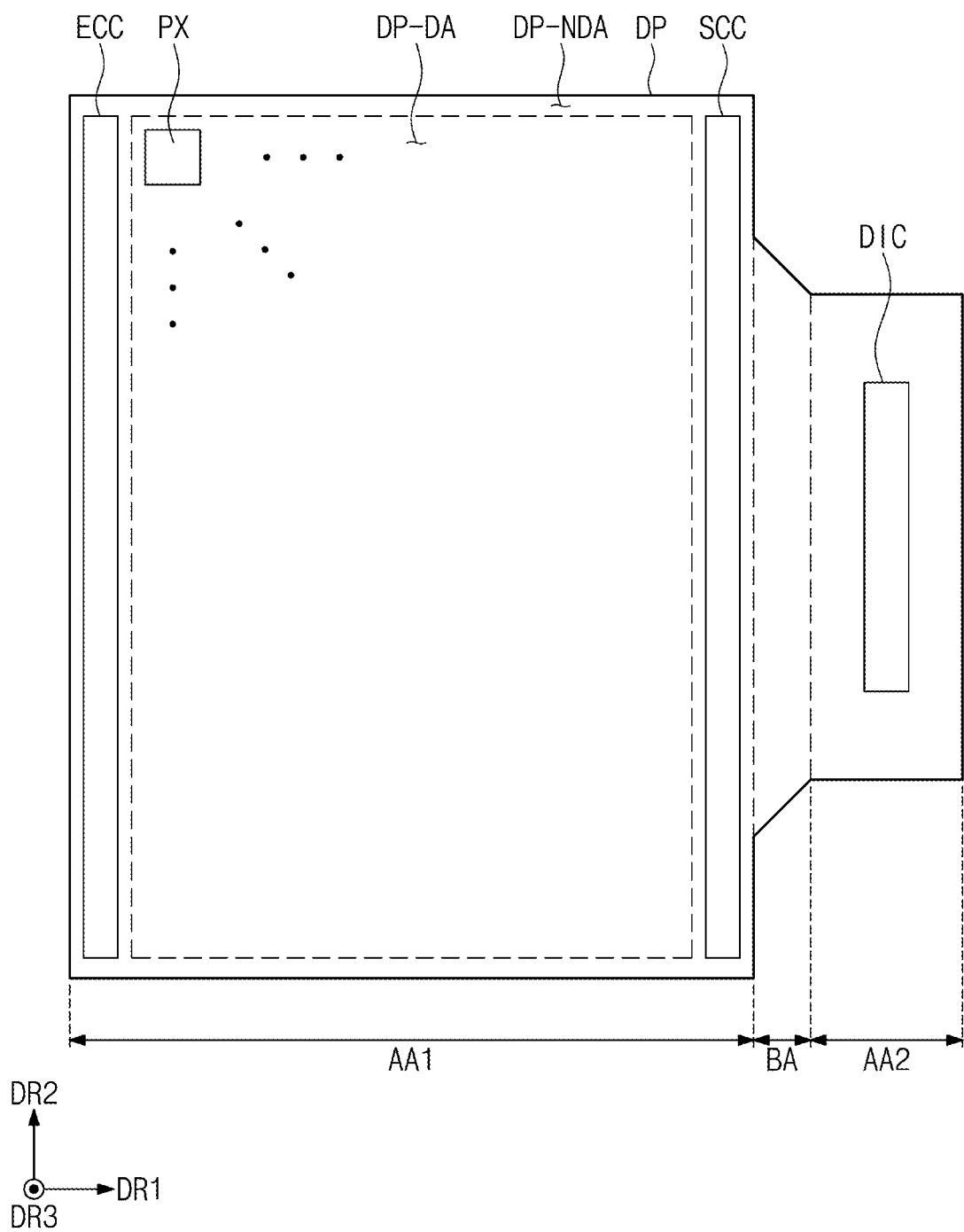
FIG. 3 is a plan view showing a display panel according to an embodiment.

FIG. 3 is a plan view showing the display panel DP according to an embodiment.

Referring to FIG. 3, the display panel DP may include the display area DP-DA and the non-display area DP-NDA around the display area DP-DA. The display area DP-DA and the non-display area DP-NDA may be distinguished from each other by whether a pixel PX is disposed or not. The pixel PX may be disposed in the display area DP-DA and may not be disposed in the non-display area DP-NDA. A scan driving circuit SCC, a data driving circuit, and an emission driving circuit ECC may be disposed in the non-display area DP-NDA. The data driving circuit may be a circuit implemented in the driving chip DIC.

The emission driving circuit ECC and the scan driving circuit SCC may be formed through the same processes as those of circuits of the display panel DP. The emission driving circuit ECC and the scan driving circuit SCC may be disposed in areas spaced apart from each other with the display area DP-DA interposed therebetween; however, embodiments are not limited thereto or thereby. For example, the emission driving circuit ECC may be disposed adjacent to the scan driving circuit SCC.

The display panel DP may include a first panel area AA1, a second panel area AA2, and a bending area BA distinguished from each other along the first direction DR1. The second panel area AA2 and the bending area BA may be portions of the non-display area DP-NDA. The bending area BA may be defined between the first panel area AA1 and the second panel area AA2.

The first panel area AA1 may correspond to the display surface DS of FIG. 1A. The first panel area AA1 may correspond to the first non-folding area NFA1 (refer to FIG. 1A), the second non-folding area NFA2 (refer to FIG. 1A), and the folding area FA (refer to FIG. 1A).

A length or width in the second direction DR2 of the bending area BA and the second panel area AA2 may be smaller than a length or width in the second direction DR2 of the first panel area AA1. An area where a length in a bending axis direction is relatively short may be more easily bent.

The scan driving circuit SCC may be disposed in the first panel area AA1, and the driving chip DIC may be mounted on the second panel area AA2. For instance, the data driving circuit of the driving chip DIC may be electrically connected to the display panel DP through the second panel area AA2. The scan driving circuit SCC and the data driving circuit may be arranged in the first direction DR1.

Figure 4:
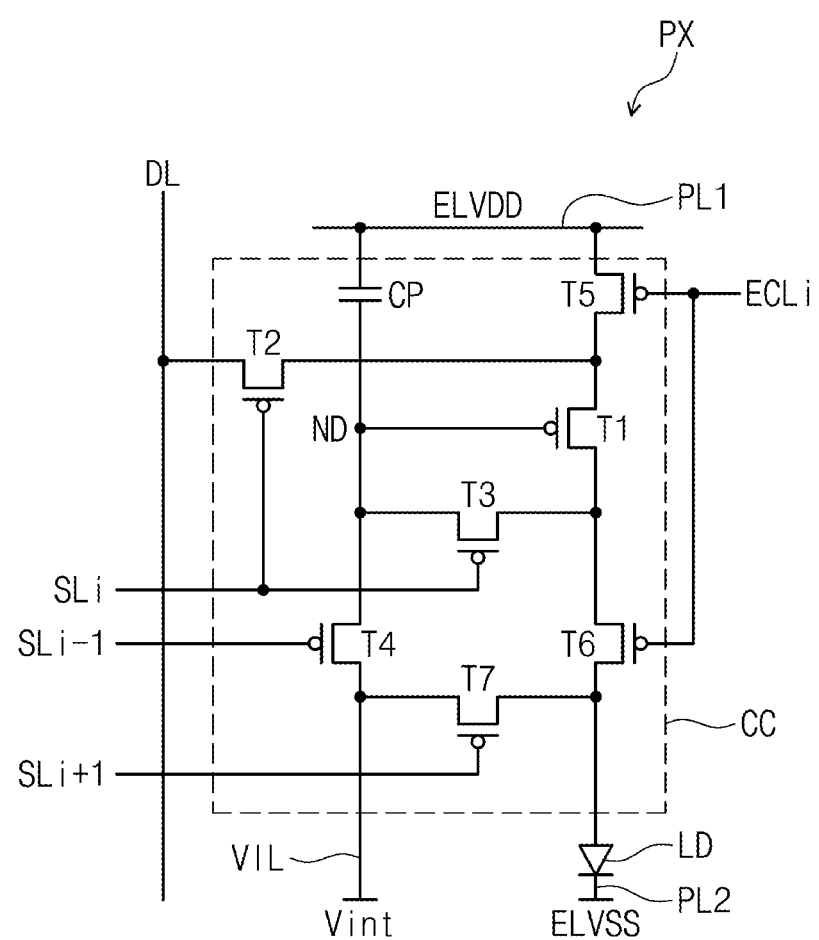
FIG. 4 is an equivalent circuit diagram of a pixel according to an embodiment.

FIG. 4 is an equivalent circuit diagram of the pixel PX according to an embodiment.

Referring to FIG. 4, the pixel PX may include a light emitting element LD and a pixel circuit CC. The pixel circuit CC may include a plurality of transistors T1, T2, T3, T4, T5, T6, and T7 and a capacitor CP. The pixel circuit CC may control an amount of current flowing through the light emitting element LD in response to a data signal. The light emitting element LD may emit light at a predetermined luminance in response to the amount of current provided from the pixel circuit CC. To this end, a first power ELVDD may have a level that is set higher than a level of a second power ELVSS.

The pixel PX may be electrically connected to a plurality of signal lines. FIG. 4 shows scan lines SLi, SLi−1, and SLi+1, a data line DL, a first power line PL1, a second power line PL2, an initialization power line VIL, and an emission control line ECLi among the signal lines. However, this is merely one example, the pixel PX may be further connected to various signal lines, and some of the signal lines may be omitted.

Each of the transistors T1 to T7 may include an input electrode (or a source electrode), an output electrode (or a drain electrode), and a control electrode (or a gate electrode). In the following description, for convenience of explanation, one electrode of the input electrode and the output electrode may be referred to as a first electrode, and the other electrode of the input electrode and the output electrode may be referred to as a second electrode.

A first electrode of a first transistor T1 may be connected to the first power line PL1 via a fifth transistor T5. The first power line PL1 may be a line to which the first power ELVDD is applied. A second electrode of the first transistor T1 may be connected to a first electrode (or an anode) of the light emitting element LD via a sixth transistor T6. The first transistor T1 may be referred to as a driving transistor.

The first transistor T1 may control the amount of current flowing through the light emitting element LD in response to a voltage applied to a control electrode of the first transistor T1.

A second transistor T2 may be connected between the data line DL and the first electrode of the first transistor T1. A control electrode of the second transistor T2 may be connected to an i-th scan line SLi. When an i-th scan signal is applied to the i-th scan line SLi, the second transistor T2 may be turned on and may electrically connect the data line DL to the first electrode of the first transistor T1.

A third transistor T3 may be connected between the second electrode of the first transistor T1 and the control electrode of the first transistor T1. A control electrode of the third transistor T3 may be connected to the i-th scan line SLi. When the i-th scan signal is applied to the i-th scan line SLi, the third transistor T3 may be turned on and may electrically connect the second electrode of the first transistor T1 to the control electrode of the first transistor T1. Accordingly, when the third transistor T3 is turned on, the first transistor T1 may be connected in a diode configuration.

A fourth transistor T4 may be connected between a node ND and the initialization power line VIL. A control electrode of the fourth transistor T4 may connected to an (i−1)th scan line SLi−1. The node ND may be a node at which the fourth transistor T4 is connected to the control electrode of the first transistor T1. When an (i−1)th scan signal is applied to the (i−1)th scan line SLi−1, the fourth transistor T4 may be turned on and may provide an initialization voltage Vint to the node ND.

The fifth transistor T5 may be connected between the first power line PL1 and the first electrode of the first transistor T1. The sixth transistor T6 may be connected between the second electrode of the first transistor T1 and the first electrode of the light emitting element LD. A control electrode of the fifth transistor T5 and a control electrode of the sixth transistor T6 may be connected to an i-th emission control line ECLi.

A seventh transistor T7 may be connected between the initialization power line VIL and the first electrode of the light emitting element LD. A control electrode of the seventh transistor T7 may be connected to the (i+1)th scan line SLi+1. When an (i+1)th scan signal is applied to the (i+1)th scan line SLi+1, the seventh transistor T7 may be turned on and may provide the initialization voltage Vint to the first electrode of the light emitting element LD.

The seventh transistor T7 may improve a black expression ability of the pixel PX. For instance, when the seventh transistor T7 is turned on, a parasitic capacitance of the light emitting element LD may be discharged. Accordingly, when implementing a black luminance, the light emitting element LD does not emit the light even though a leakage current occurs from the first transistor T1, and thus, the black expression ability may be improved.

In FIG. 4, the control electrode of the seventh transistor T7 is connected to the (i+1)th scan line SLi+1, however, it should not be limited thereto or thereby. According to an embodiment, the control electrode of the seventh transistor T7 may be connected to the (i−1)th scan line SLi−1 or the i-th scan line SLi.

FIG. 4 illustrates PMOS transistors as a reference of the pixel circuit CC, however, embodiments are not limited thereto or thereby. According to an embodiment, the pixel circuit CC may be implemented by NMOS transistors. According to an embodiment, the pixel circuit CC may be implemented by a combination of NMOS and PMOS transistors.

The capacitor CP may be disposed between the first power line PL1 and the node ND. The capacitor CP may be charged with a voltage corresponding to the data signal. When the fifth and sixth transistors T5 and T6 are turned on, the amount of the current flowing through the first transistor T1 may be determined according to the voltage charged in the capacitor CP.

The light emitting element LD may be electrically connected to the sixth transistor T6 and the second power line PL2. The light emitting element LD may receive the second power ELVSS via the second power line PL2.

The light emitting element LD may emit light according to a voltage corresponding to a difference between the signal provided through the sixth transistor T6 and the second power ELVSS provided through the second power line PL2.

The equivalent circuit of the pixel circuit CC should not be limited to the equivalent circuit shown in FIG. 4. According to an embodiment, the pixel circuit CC may be implemented in various ways to allow the light emitting element LD to emit light.

Figure 5:
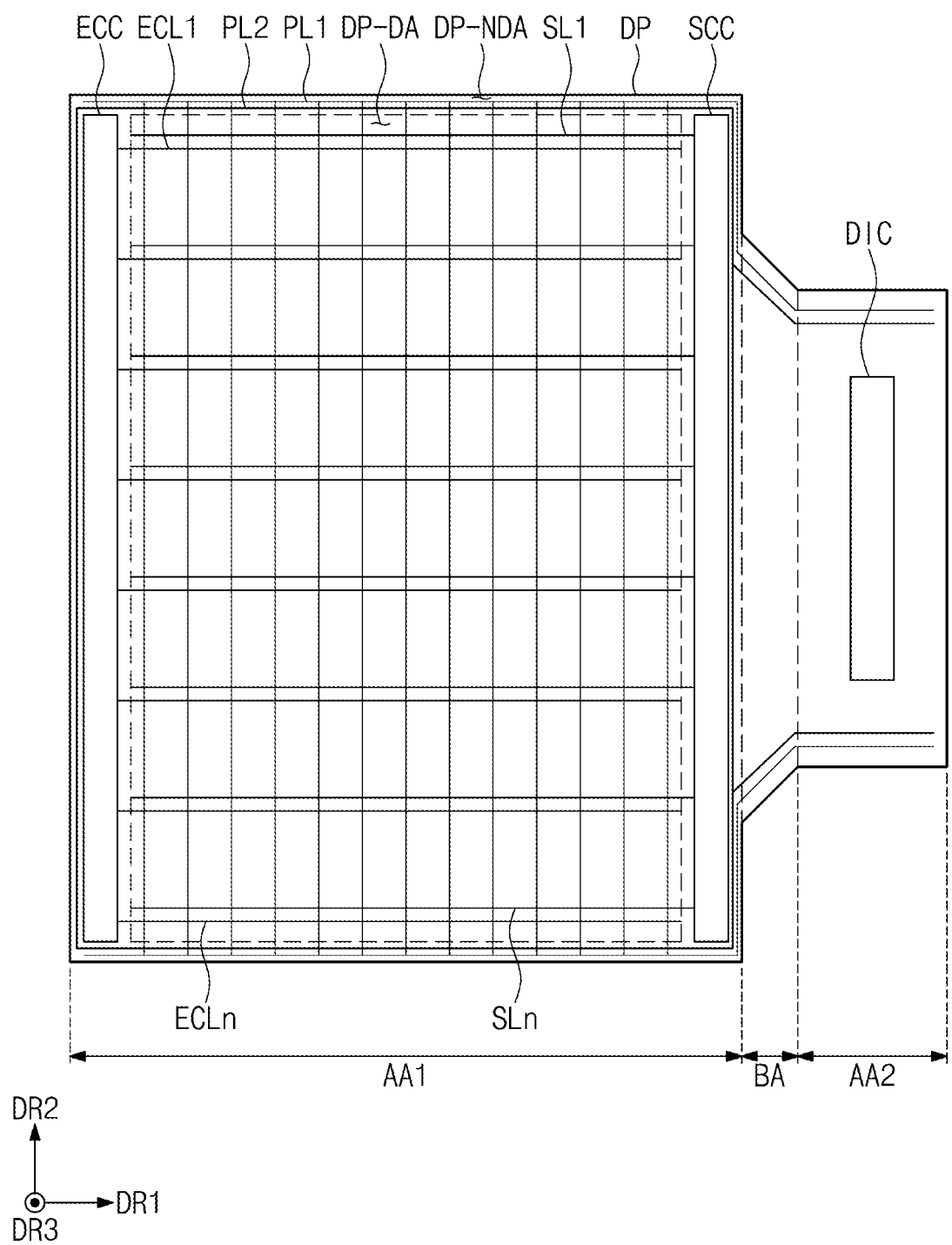
FIG. 5 is a plan view showing a display panel according to an embodiment.
Figure 6:
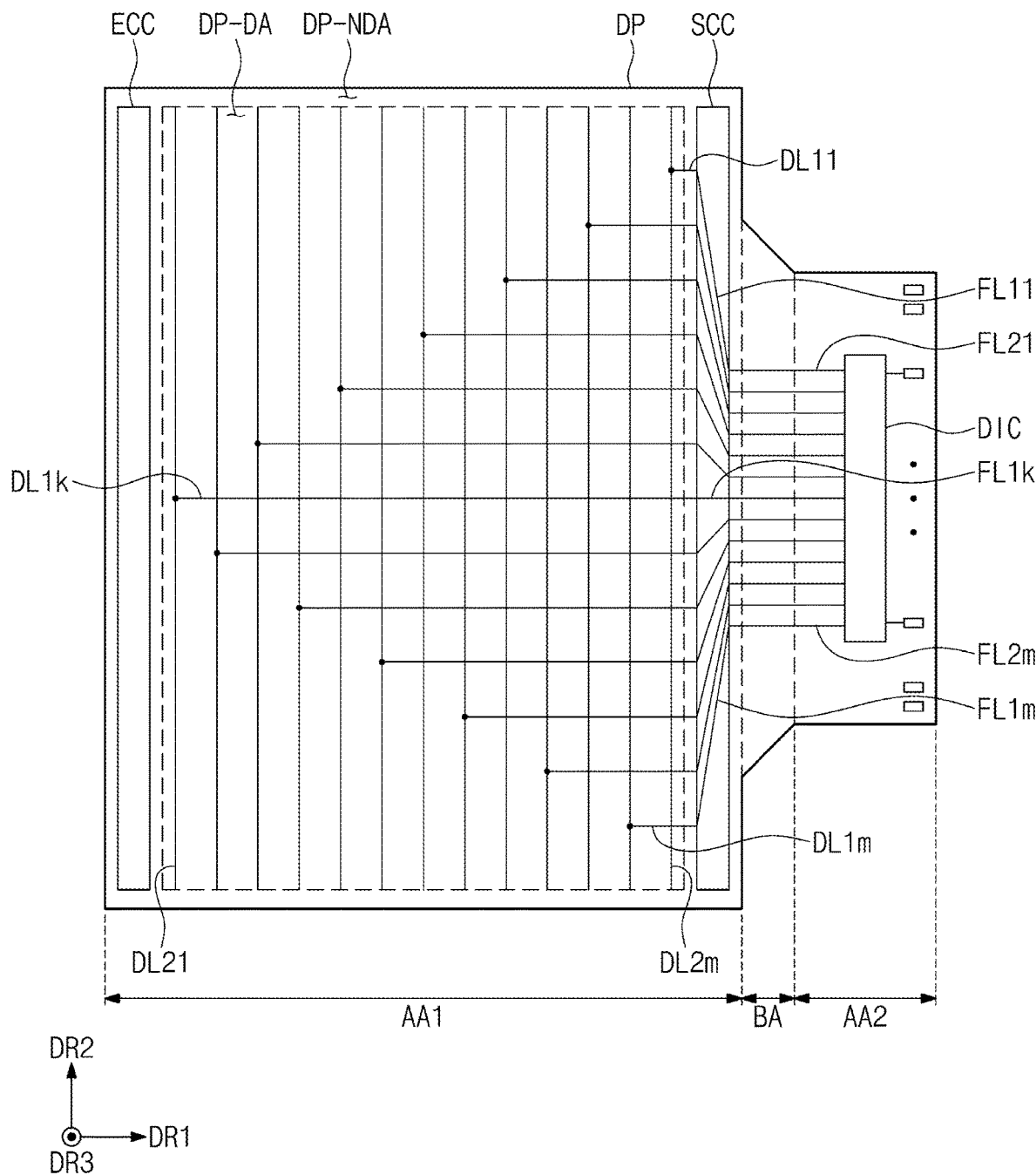
FIG. 6 is a plan view showing a display panel according to an embodiment.

FIG. 5 is a plan view showing the display panel DP according to an embodiment. FIG. 6 is a plan view showing the display panel DP according to an embodiment. FIGS. 5 and 6 show only a portion of the display module DM.

Referring to FIGS. 5 and 6, a plurality of scan lines SL1 to SLn, a plurality of data lines DL11 to DL1$m$ and DL21 to DL2$m$, and a portion of the first power line PL1 may be disposed in the display area DP-DA of the display panel DP. The scan driving circuit SCC, the emission driving circuit ECC, the driving chip DIC, a plurality of fan-out lines FL11 to FL1$m$ and FL21 to FL2$m$, the other portion of the first power line PL1, and the second power line PL2 may be disposed in the non-display area DP-NDA of the display panel DP.

The scan lines SL1 to SLn may extend in the first direction DR1 and may be arranged (e.g., spaced apart from one another) in the second direction DR2. The scan lines SL1 to SLn may be electrically connected to the scan driving circuit SCC and may receive scan signals from the scan driving circuit SCC.

The user may scroll a screen while using the electronic device ED (refer to FIG. 1A). For instance, a scroll direction DR-SC (refer to FIG. 1A) shown in FIG. 1A may be a direction along which the user scrolls the most frequently. According to an embodiment, the arrangement direction of the scan lines SL1 to SLn may be the same as the scroll direction DR-SC, which is frequently used. In this case, although the user scrolls the screen of the electronic device ED (refer to FIG. 1A), defects caused by overlapping new data and previous data may be minimized or at least reduced. Accordingly, a display quality of the electronic device ED (refer to FIG. 1A) may be improved. According to an embodiment, a direction in which the folding axis FX (refer to FIG. 1B) extends may be substantially the same as the arrangement direction of the scan lines SL1 to SLn.

The data lines DL11 to DL1$m$ and DL21 to DL2$m$ may receive data signals from the data driving circuit. The data driving circuit may be provided in the driving chip DIC. The data lines DL11 to DL1$m$ and DL21 to DL2$m$ may include a plurality of first data lines DL11 to DL1$m$ and a plurality of second data lines DL21 to DL2$m$. Each of the first data lines DL11 to DL1$m$ may be electrically connected to a corresponding data line among the second data lines DL21 to DL2$m$.

The first data lines DL11 to DL1$m$ may extend in the first direction DR1 and may be arranged in the second direction DR2. The second data lines DL21 to DL2$m$ may extend in the second direction DR2 and may be arranged in the first direction DR1.

The first data lines DL11 to DL1$m$ may have different lengths from each other. The second data lines DL21 to DL2$m$ may have the same length as each other. The length of the first data lines DL11 to DL1$m$ may be determined by a length of the fan-out lines FL11 to FL1$m$ and FL21 to FL2$m$ connecting the first data lines DL11 to DL1$m$ to the driving chip DIC. As an example, the first data line DL11 having the shortest length among the first data lines DL11 to DL1$m$ may be electrically connected to the fan-out lines FL11 and FL21 having the longest length among the fan-out lines FL11 to FL1$m$ and FL21 to FL2$m$.

The fan-out lines FL11 to FL1$m$ and FL21 to FL2$m$ may include first fan-out lines FL11 to FL1$m$ and second fan-out lines FL21 to FL2$m$. The first fan-out lines FL11 to FL1$m$ may be electrically connected to the second fan-out lines FL21 to FL2$m$ in a one-to-one correspondence relation. The first fan-out lines FL11 to FL1$m$ may overlap the scan driving circuit SCC. The second fan-out lines FL21 to FL2$m$ may not overlap the scan driving circuit SCC and may be disposed in the bending area BA.

The first data lines DL11 to DL1$m$ may be electrically connected to the first fan-out lines FL11 to FL1$m$, respectively. The length of the first data line DL11 may be shorter than the length of another first data line DL1$k$. The length of the first fan-out line FL11 electrically connected to the first data line DL11 may be longer than the length of another first fan-out line FL1$k$ connected to another first data line DL1$k$. For instance, as the fan-out line having a relatively long length is electrically connected to the data line having a relatively short length, a resistance deviation due to the length of the line may be reduced.

Figure 7:
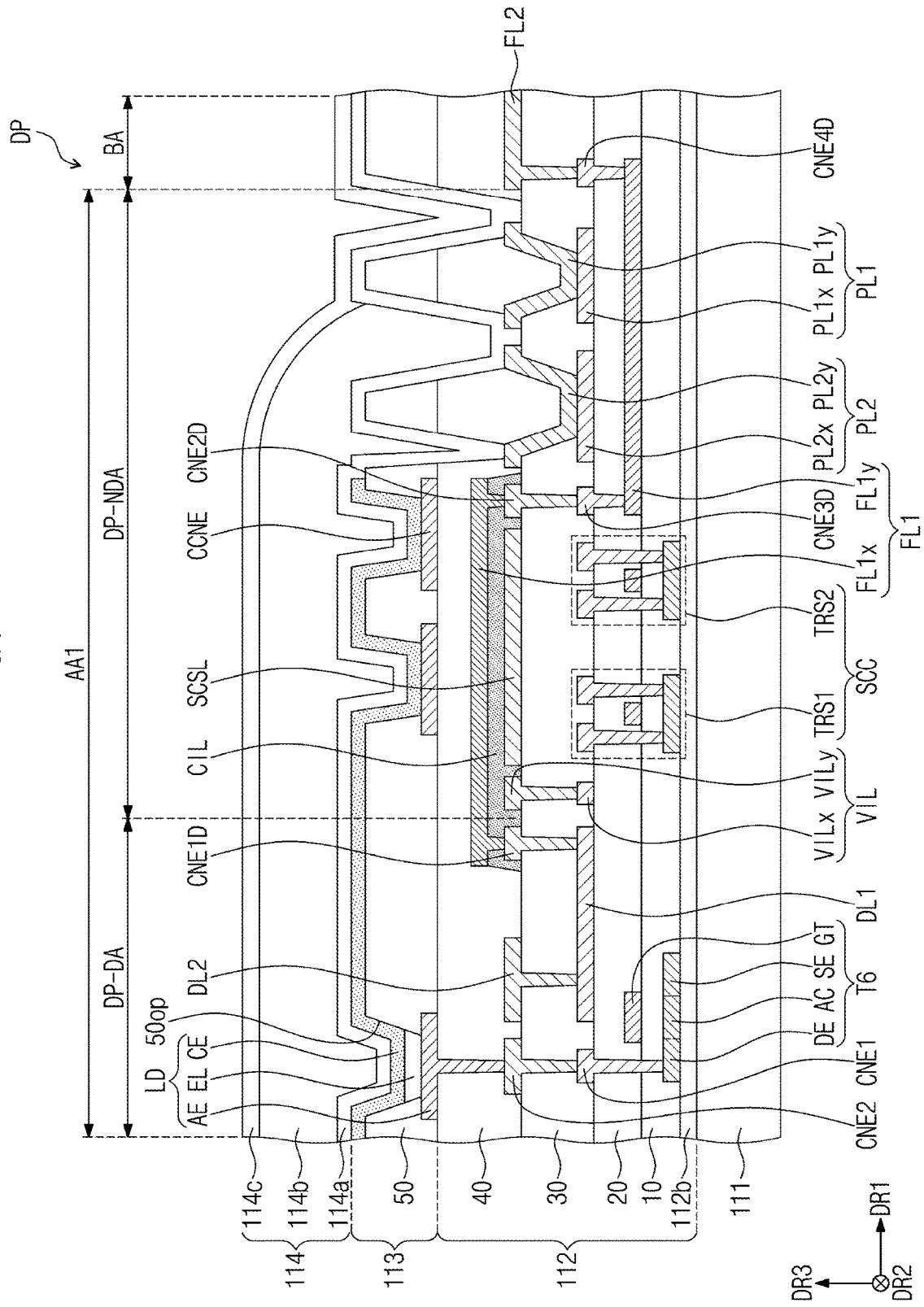
FIG. 7 is a cross-sectional view showing a display panel according to an embodiment.

FIG. 7 is a cross-sectional view showing the display panel DP according to an embodiment.

Referring to FIG. 7, the display panel DP may have a configuration that substantially generates the image. The display panel DP may be a light emitting type display panel. For example, the display panel DP may be an organic light emitting display panel, a quantum dot display panel, a micro-LED display panel, or a nano-LED display panel, but embodiments are not limited thereto or thereby. Hereinafter, the organic light emitting display panel will be described as a representative example of the display panel DP.

The display panel DP may include a base layer 111, a circuit layer 112, a light emitting element layer 113, and an encapsulation layer 114.

The base layer 111 may be a member that provides a base surface on which the circuit layer 112 is disposed. The base layer 111 may be at least one of a glass substrate, a metal substrate, and a polymer substrate. However, embodiments are not limited thereto or thereby, and the base layer 111 may be an inorganic layer, an organic layer, or a composite material layer(s).

The base layer 111 may have a multi-layer structure. For example, the base layer 111 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide-based resin. In addition, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. For the purposes of this disclosure, the term "A-based resin" means that a functional group of "A" is included.

The circuit layer 112 may be disposed on the base layer 111. The circuit layer 112 may include an insulating layer, a semiconductor pattern, a conductive pattern, and a signal line. The insulating layer, a semiconductor layer, and a conductive layer may be formed on the base layer 111 by a coating or depositing process. Then, the insulating layer, the semiconductor layer, and the conductive layer may be selectively patterned by a plurality of photolithography processes. The semiconductor pattern, the conductive pattern, and the signal line included in the circuit layer 112 may be formed.

At least one inorganic layer 112b may be disposed on an upper surface of the base layer 111. The inorganic layer 112b may include at least one of aluminum oxide, titanium oxide, silicon oxide, silicon nitride, silicon oxynitride, zirconium oxide, and hafnium oxide. The inorganic layer 112b may be formed in multiple layers. The inorganic layers may form a barrier layer and/or a buffer layer.

The semiconductor pattern may be disposed on the inorganic layer 112b. The semiconductor pattern may include polysilicon; however, embodiments are not limited thereto or thereby. For instance, the semiconductor pattern may include amorphous silicon or oxide semiconductor.

FIG. 7 shows only a portion of the semiconductor pattern, and the semiconductor pattern may be further disposed in other areas. The semiconductor pattern may be arranged with a specific rule over the pixels. The semiconductor pattern may have different electrical properties depending on whether it is doped or not or whether it is doped with an N-type dopant or a P-type dopant. The semiconductor pattern may include a first region having a relatively high conductivity and a second region having a relatively low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or a region doped at a concentration lower than that of the first region.

The first region may have a conductivity greater than that of the second region. The first region may substantially serve as an electrode or signal line. The second region may substantially correspond to an active area (or a channel) of the transistor. In other words, a portion of the semiconductor pattern may be the active area of the transistor, another portion of the semiconductor pattern may be a source or a drain of the transistor, and the other portion of the semiconductor pattern may be a connection electrode or a connection signal line.

FIG. 7 shows the sixth transistor T6 and the light emitting element LD, which are included in the pixel PX. A source SE, an active area AC, and a drain DE of the sixth transistor T6 may be formed from the semiconductor pattern. The source SE and the drain DE may extend in opposite directions to each other from the active area AC in a cross-section.

A first insulating layer 10 may be disposed on the inorganic layer 112b. The first insulating layer 10 may commonly overlap the pixels and may cover the semiconductor pattern. The first insulating layer 10 may be an inorganic layer and/or an organic layer and may have a single-layer or multi-layer structure. The first insulating layer 10 may include at least one of aluminum oxide, titanium oxide, silicon oxide, silicon nitride, silicon oxynitride, zirconium oxide, and hafnium oxide. For instance, the first insulating layer 10 may have a single-layer structure of a silicon oxide layer. Not only the first insulating layer 10, but also an insulating layer of the circuit layer 112 described later may be an inorganic layer and/or an organic layer and may have a single-layer or multi-layer structure. The inorganic layer may include at least one of the above-mentioned materials; however, embodiments are not limited thereto or thereby.

A gate GT of the sixth transistor T6 may be disposed on the first insulating layer 10. The gate GT may be a portion of a metal pattern. The gate GT may overlap the active area AC. The gate GT may be used as a mask in a process of doping the semiconductor pattern.

A second insulating layer 20 may be disposed on the first insulating layer 10 and may cover the gate GT. The second insulating layer 20 may be an inorganic layer and/or an organic layer and may have a single-layer or multi-layer structure. The second insulating layer 20 may include at least one of silicon oxide, silicon nitride, and silicon oxynitride. In the present embodiment, the second insulating layer 20 may have a multi-layer structure of a silicon oxide layer and a silicon nitride layer.

A first connection electrode CNE1 may be disposed on the second insulating layer 20. The first connection electrode CNE1 may be connected to the drain DE of the sixth transistor T6 via a contact hole defined through the first and second insulating layers 10 and 20.

A third insulating layer 30 may be disposed on the second insulating layer 20. The third insulating layer 30 may be an organic layer.

A second connection electrode CNE2 may be disposed on the third insulating layer 30. The second connection electrode CNE2 may be connected to the first connection electrode CNE1 via a contact hole defined through the third insulating layer 30.

A fourth insulating layer 40 may be disposed on the third insulating layer 30 and may cover the second connection electrode CNE2. The fourth insulating layer 40 may be an organic layer.

The scan driving circuit SCC may include a plurality of transistors TRS1 and TRS2. The scan driving circuit SCC may be disposed in the first panel area AA1. The transistors TRS1 and TRS2 may be formed through the same processes as those of the sixth transistor T6.

A second data line DL2 may be electrically connected to the driving chip DIC (refer to FIG. 6) via a first data line DL1, a first fan-out line FL1, and a second fan-out line FL2. The second data line DL2 may be one of the second data lines DL21 to DL2m (refer to FIG. 6), and the first data line DL1 may be one of the first data lines DL11 to DL1m (refer to FIG. 6), which is connected to the second data line DL2. The first fan-out line FL1 may be one of the first fan-out lines FL11 to FL1m, which is electrically connected to the first data line DL1, and the second fan-out line FL2 may be one of the second fan-out lines FL21 to FL2m, which is connected to the first fan-out line FL1.

The second data line DL2 may be disposed on the third insulating layer 30 and may be covered by the fourth insulating layer 40. The second data line DL2 may be disposed on the same layer as the second connection electrode CNE2. The first data line DL1 may be disposed on a layer different from a layer on which the second data line DL2 is disposed. For example, the first data line DL1 may be disposed on the second insulating layer 20 and may be covered by the third insulating layer 30.

A cover insulating layer CIL may be further disposed on the third insulating layer 30. As an example, the cover insulating layer CIL may be disposed to overlap an area in which the scan driving circuit SCC is disposed. The cover insulating layer CIL may be disposed between the third insulating layer 30 and the fourth insulating layer 40.

The first fan-out line FL1 may include a first fan-out portion FL1x and a second fan-out portion FL1y. The first fan-out portion FL1x may overlap the scan driving circuit SCC. The second fan-out portion FL1y may overlap the first power line PL1 and the second power line PL2. The first fan-out portion FL1x and the second fan-out portion FL1y may be disposed on different layers from each other. The first fan-out portion FL1x may be disposed on the cover insulating layer CIL. The first fan-out portion FL1x may include at least one of a metal material, a metal alloy, and a transparent conductive oxide. As an example, the first fan-out portion FL1x may include molybdenum, Ti/Al/Ti, indium tin oxide (ITO), indium zinc oxide (IZO), zinc oxide (ZnO), or indium zinc tin oxide (IZTO).

The first fan-out portion FL1x may be electrically connected to the first data line DL1 via a first connection electrode CNE1D. The first connection electrode CNE1D may be disposed on the same layer as the second connection electrode CNE2.

The second fan-out portion FL1y may be electrically connected to the first fan-out portion FL1x via a second connection electrode CNE2D and a third connection electrode CNE3D. The second connection electrode CNE2D may be disposed on the same layer as the second connection electrode CNE2, and the third connection electrode CNE3D may be disposed on the same layer as the first connection electrode CNE1.

The second fan-out portion FL1y and the second fan-out line FL2 may be electrically connected to each other via a fourth connection electrode CNE4D. The fourth connection electrode CNE4D may be disposed on the same layer as the third connection electrode CNE3D. The first fan-out portion FL1x and the second fan-out portion FL1y may be disposed in the first panel area AA1, and the second fan-out line FL2 may be disposed in the bending area BA.

A shielding layer SCSL may be further disposed between the first fan-out portion FL1x and the scan driving circuit SCC. The shielding layer SCSL may prevent the scan driving circuit SCC from being influenced by a signal or data provided through the first fan-out portion FL1x. The shielding layer SCSL may be disposed on the third insulating layer 30 and may be disposed on the same layer as the second data line DL2. The second power ELVSS (refer to FIG. 4) may be applied to the shielding layer SCSL.

Each of the first power line PL1, the second power line PL2, and the initialization power line VIL may include at least two layers. As an example, the first power line PL1 may include a first line layer PL1x and a second line layer PL1y electrically connected to the first line layer PL1x, and the second power line PL2 may include a first line layer PL2x and a second line layer PL2y electrically connected to the first line layer PL2x. The initialization power line VIL may include a first initialization line layer VILx and a second initialization line layer VILy electrically connected to the first initialization line layer VILx.

The first line layer PL1x, the first line layer PL2x, and the first initialization line layer VILx may be disposed on the same layer as each other, e.g., on the second insulating layer 20. The first line layer PL1x, the first line layer PL2x, and the first initialization line layer VILx may be disposed on the same layer as the first data line DL1.

The second line layer PL1y, the second line layer PL2y, and the second initialization line layer VILy may be disposed on the same layer as each other, e.g., on the third insulating layer 30. The second line layer PL1y, the second line layer PL2y, and the second initialization line layer VILy may be disposed on the same layer as the second data line DL2.

The light emitting element layer 113 including the light emitting element LD may be disposed on the circuit layer 112. The light emitting element LD may include a first electrode AE, a light emitting layer EL, and a second electrode CE.

The first electrode AE may be disposed on the fourth insulating layer 40. The first electrode AE may be in contact with the second connection electrode CNE2 via a contact hole defined through the fourth insulating layer 40.

A pixel definition layer 50 may be disposed on the fourth insulating layer 40 and may cover a portion of the first electrode AE. The pixel definition layer 50 may be provided with an opening 50op defined therethrough. At least a portion of the first electrode AE may be exposed through the opening 50op of the pixel definition layer 50.

The light emitting layer EL may be disposed on the first electrode AE. The light emitting layer EL may be disposed to correspond to the opening 50op. For instance, the light emitting layer EL may be formed in each pixel after being divided into plural portions. When the light emitting layer EL is formed in each pixel after being divided into the plural portions, each of the light emitting layers EL may emit light having at least one of blue, red, and green colors; however, embodiments are not limited thereto or thereby. The light emitting layer EL may be commonly provided in the pixels. In this case, the light emitting layer EL may emit a blue light or a white light.

The second electrode CE may be disposed on the light emitting layer EL. The second electrode CE may have an integral-body shape and may be commonly disposed over the pixels.

In some embodiments, a hole control layer may be disposed between the first electrode AE and the light emitting layer EL. The hole control layer may include a hole transport layer and may further include a hole injection layer. An electron control layer may be disposed between the light emitting layer EL and the second electrode CE. The electron control layer may include an electron transport layer and may further include an electron injection layer. Each of the hole control layer and the electron control layer may be commonly formed in the plural pixels using an open mask.

The second electrode CE may be in contact with a connection electrode CCNE. The connection electrode CCNE may be disposed on the fourth insulating layer 40. The connection electrode CCNE may be disposed on the same layer as the first electrode AE. The connection electrode CCNE may be electrically connected to the second power line PL2 and may receive the second power ELVSS (refer to FIG. 4). The second electrode CE may be referred to as a common electrode, and the second power ELVSS (refer to FIG. 4) may be referred to as a common voltage.

The encapsulation layer 114 may be disposed on the light emitting element layer 113. The encapsulation layer 114 may include an inorganic layer 114a, an organic layer 114b, and an inorganic layer 114c, which are sequentially stacked one on another; however, the layers of the encapsulation layer 114 are not limited thereto or thereby.

The inorganic layers 114a and 114c may protect the light emitting element layer 113 from moisture and oxygen, and the organic layer 114b may protect the light emitting element layer 113 from a foreign substance, such as dust particles. The inorganic layers 114a and 114c may include at least one of a silicon nitride layer, a silicon oxynitride layer, a silicon oxide layer, a titanium oxide layer, and an aluminum oxide layer. The organic layer 114b may include an acrylic-based organic layer; however, embodiments are not limited thereto or thereby.

Figure 8:
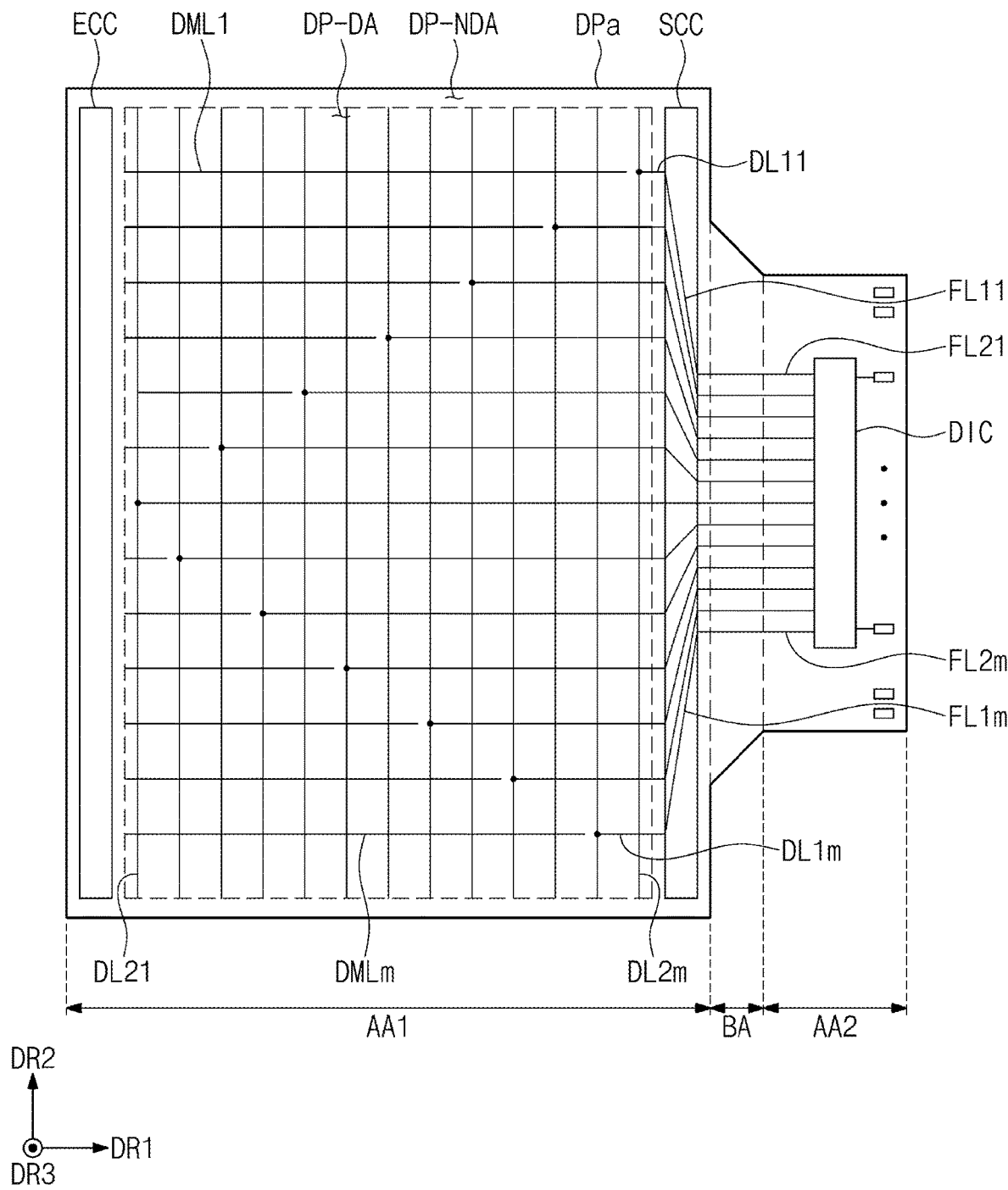
FIG. 8 is a plan view showing a display panel according to an embodiment.

FIG. 8 is a plan view showing a display panel DPa according to an embodiment. In FIG. 8, the same reference numerals denote the same elements in FIG. 6, and thus, detailed descriptions of the same element will be omitted.

Referring to FIG. 8, the display panel DPa may further include a plurality of dummy lines DML1 to DMLm. The dummy lines DML1 to DMLm may extend in the first direction DR1 and may be arranged in the second direction DR2 to be spaced apart from each other. The dummy lines DML1 to DMLm may be disposed in the display area DP-DA. The dummy lines DML1 to DMLm may face a plurality of first data lines DL11 to DL1m, respectively. The dummy lines DML1 to DMLm may be provided to prevent the first data lines DL11 to DL1m from being viewed from the outside.

One dummy line DML1 may face one first data line DL11. Since lengths of the first data lines DL11 to DL1m are not the same as each other, lengths of the dummy lines DML1 to DMLm may not be the same as each other. The dummy lines DML1 to DMLm may be electrically floated; however, embodiments are not limited thereto or thereby. A constant voltage may be applied to the dummy lines DML1 to DMLm.

The dummy lines DML1 to DMLm may be disposed on the same layer as the first data line DL1 (refer to FIG. 7). As an example, the dummy lines DML1 to DMLm may be disposed on the second insulating layer 20 shown in FIG. 7; however, embodiments are not limited thereto or thereby.

Figure 9A:
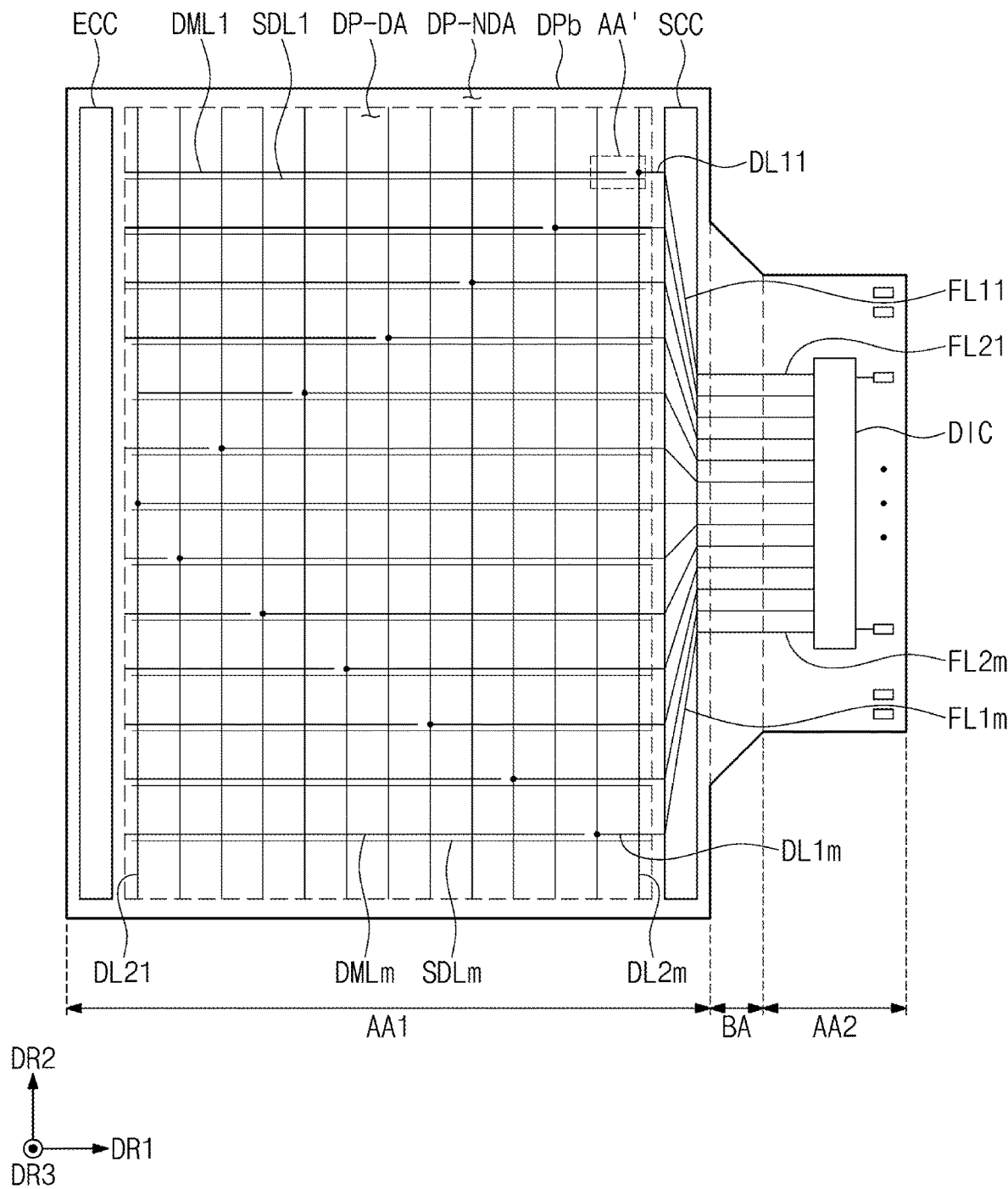
FIG. 9A is a plan view showing a display panel according to an embodiment.
Figure 9B:
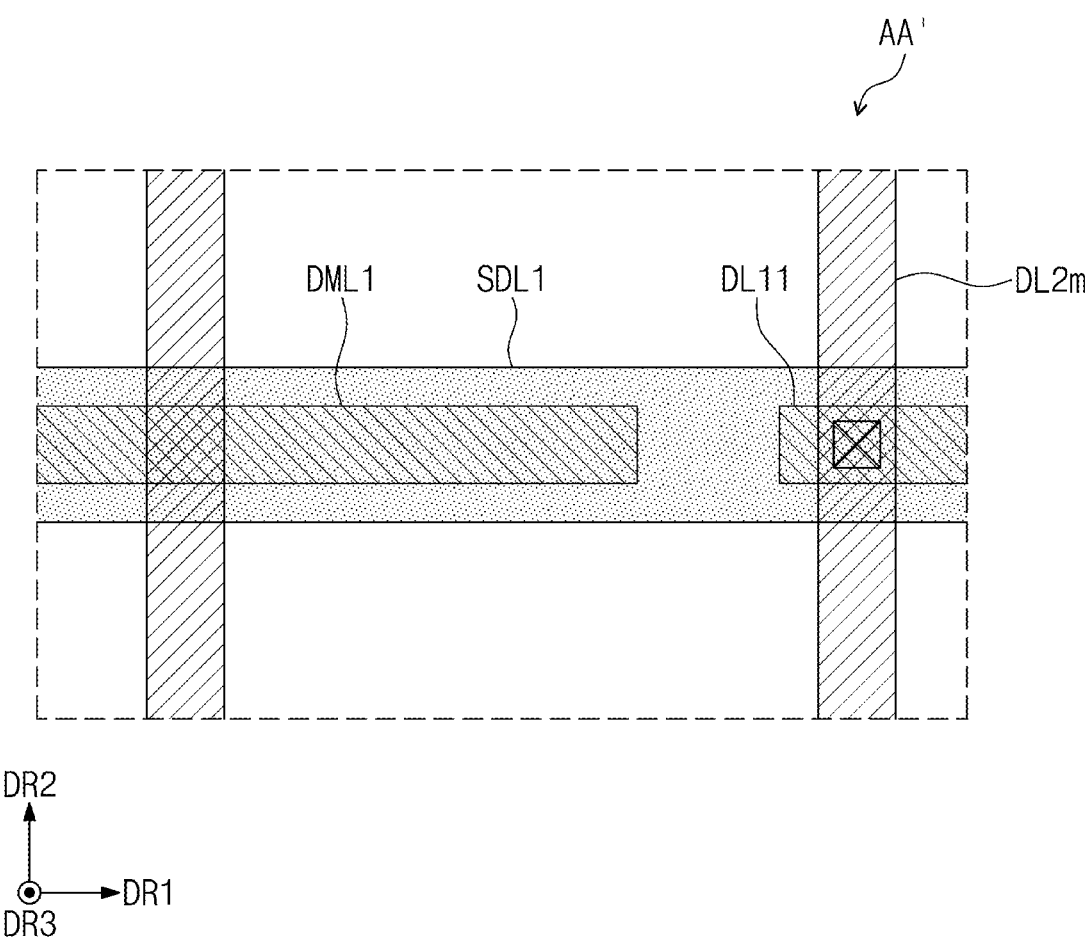
FIG. 9B is an enlarged plan view showing an area AA' of FIG. 9A according to an embodiment.

FIG. 9A is a plan view showing a display panel DPb according to an embodiment. FIG. 9B is an enlarged plan view showing an area AA' of FIG. 9A according to an embodiment. In FIGS. 9A and 9B, the same reference numerals denote the same elements in FIGS. 6 and 8, and thus, detailed descriptions of the same elements will be omitted.

Referring to FIGS. 9A and 9B, the display panel DPb may further include a plurality of shielding lines SDL1 to SDLm. The shielding lines SDL1 to SDLm may extend in the first direction DR1 and may arranged in the second direction DR2 to be spaced apart from each other. The shielding lines SDL1 to SDLm may be disposed in the display area DP-DA. One shielding line SDL1 may overlap one dummy line DML1 and one first data line DL11.

A constant voltage may be applied to the shielding lines SDL1 to SDLm. As an example, the initialization voltage Vint (refer to FIG. 4) may be applied to the shielding lines SDL1 to SDLm. The shielding lines SDL1 to SDLm may prevent a signal applied to first data lines DL11 to DL1m from being coupled with other signals.

The shielding lines SDL1 to SDLm may be disposed under the first data lines DL11 to DL1m. As an example, the shielding lines SDL1 to SDLm may be disposed between the first insulating layer 10 (refer to FIG. 7) and the second insulating layer 20 (refer to FIG. 7) or may be disposed between the inorganic layer 112b (refer to FIG. 7) and the first insulating layer 10 (refer to FIG. 7). For example, in the case where the shielding lines SDL1 to SDLm are disposed between the first insulating layer 10 and the second insulating layer 20, the shielding lines SDL1 to SDLm may be disposed on the same layer as the gate GT and may include the same material as the gate GT. In the case where the shielding lines SDL1 to SDLm are disposed between the inorganic layer 112b and the first insulating layer 10, the shielding lines SDL1 to SDLm may be disposed on the same layer as a semiconductor pattern including the source SE, the active area AC, and the drain DE. In this case, the shielding lines SDL1 to SDLm may include regions doped with dopants as the source SE and the drain DE.

Figure 10:
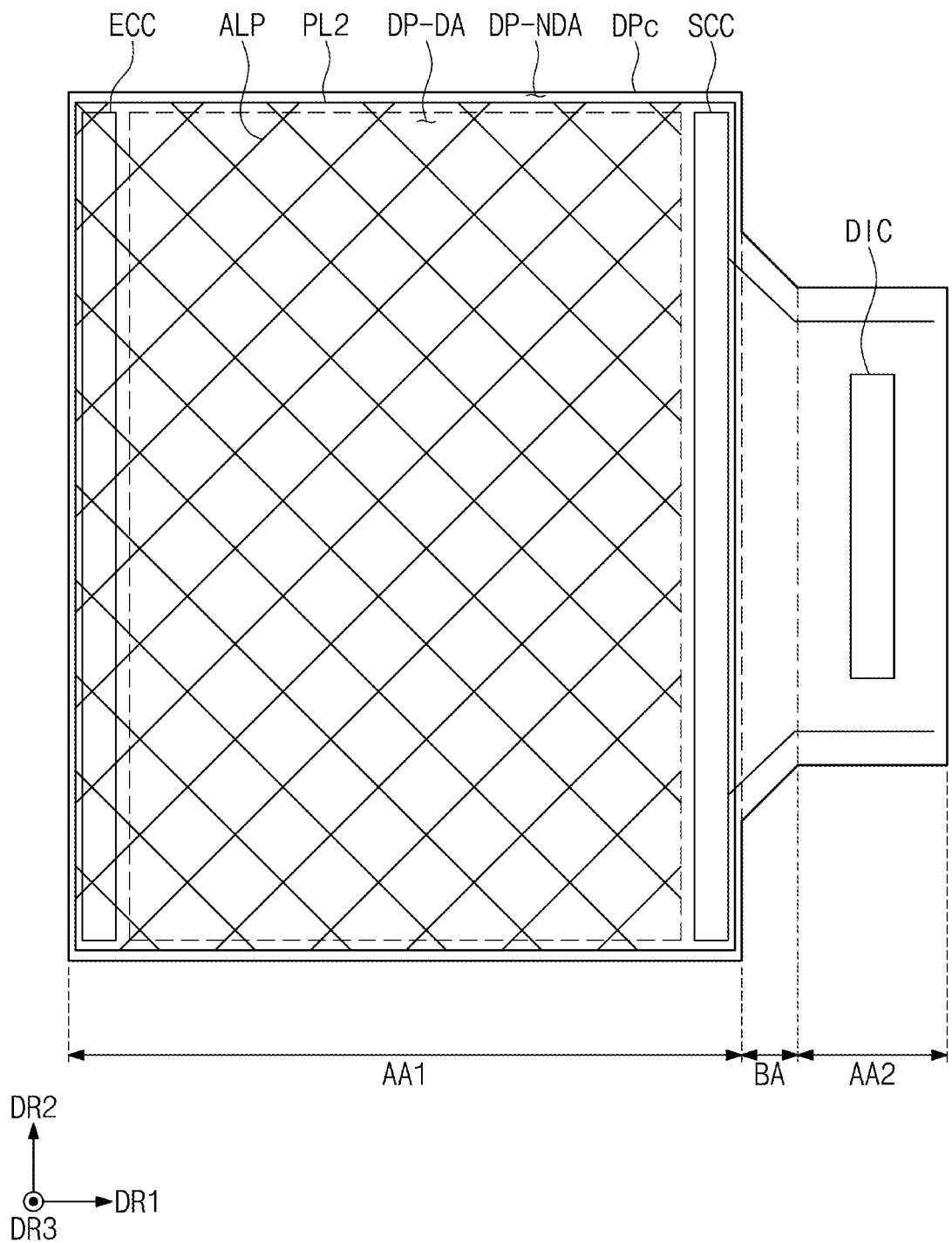
FIG. 10 is a plan view showing a display panel according to an embodiment.

FIG. 10 is a plan view showing a display panel DPc according to an embodiment. In FIG. 10, the same reference numerals denote the same elements as previously described, and thus, detailed descriptions of the same element will be omitted Referring to FIGS. 7 and 10, the display panel DPc may further include an auxiliary pattern ALP. The auxiliary pattern ALP may be electrically connected to a second power line PL2 and may receive the second power ELVSS (refer to FIG. 4). A voltage drop of the second power ELVSS (refer to FIG. 4) may decrease by the auxiliary pattern ALP. Accordingly, the second power ELVSS (refer to FIG. 4) may be uniformly applied to the second electrode CE (refer to FIG. 7).

The auxiliary pattern ALP may be disposed in the display area DP-DA. The auxiliary pattern ALP may have a mesh structure. The auxiliary pattern ALP may be provided with a plurality of openings, and the openings may overlap an emission area. The emission area may correspond to an opening 50op defined through a pixel definition layer 50.

The auxiliary pattern ALP may be disposed on the same layer as a plurality of fan-out lines. The auxiliary pattern ALP may be disposed on the same layer as a first fan-out portion FL1x and may include the same material as the first fan-out portion FL1x.

A portion of the auxiliary pattern ALP may overlap the display area DP-DA and the other portion of the auxiliary pattern ALP may overlap the non-display area DP-NDA. The auxiliary pattern ALP may be disposed on the same layer as the first fan-out portion FL1x and may be electrically insulated from the first fan-out portion FL1x. Accordingly, the auxiliary pattern ALP may be spaced apart from the first fan-out portion FL1x.

Figure 11:
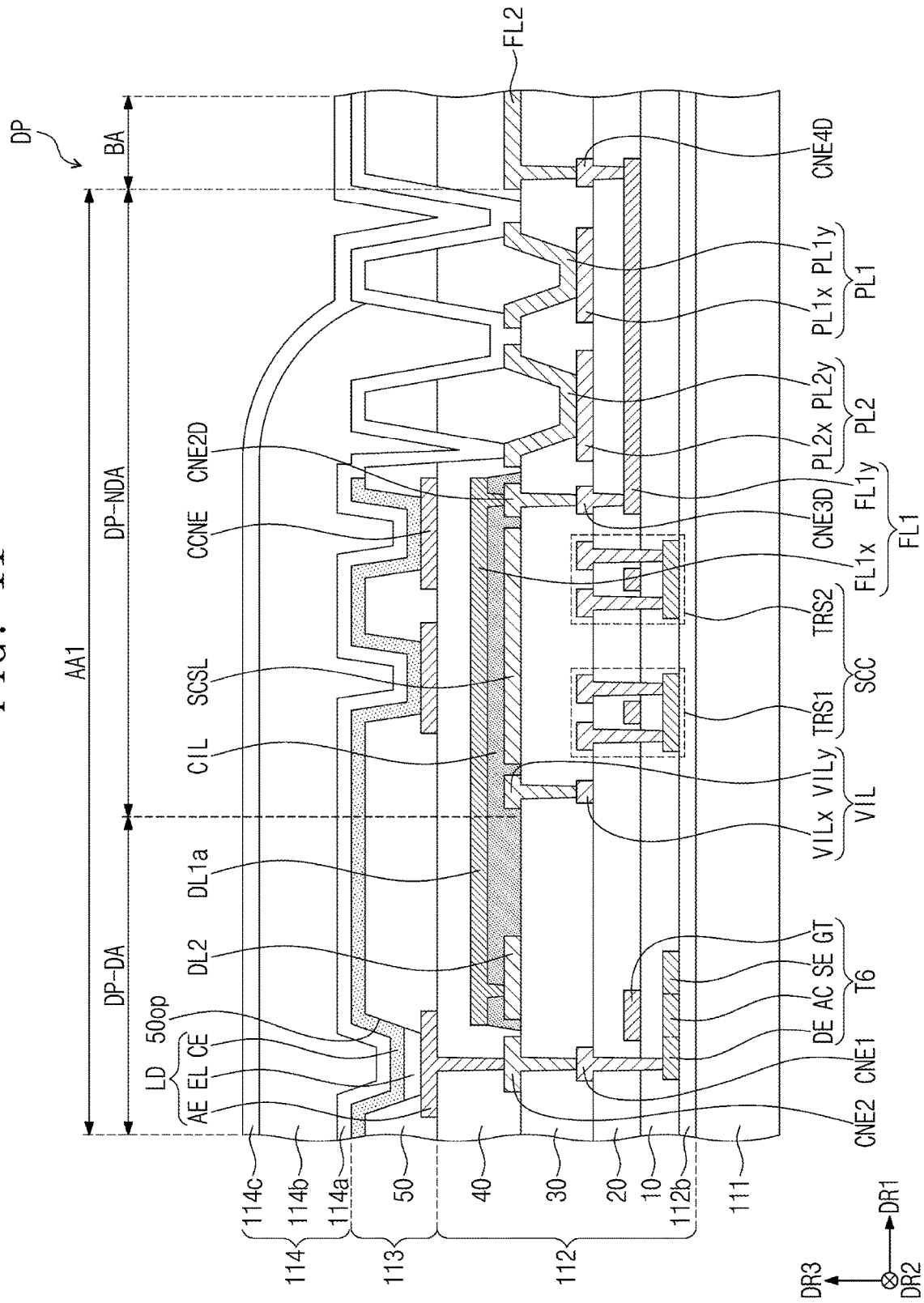
FIG. 11 is a cross-sectional view showing a display panel according to an embodiment.

FIG. 11 is a cross-sectional view showing a display panel DP according to an embodiment. In FIG. 11, the same reference numerals denote the same elements in FIG. 7, and thus, detailed descriptions of the same elements will be omitted.

When compared with FIG. 7, there is a difference in a position of a first data line DL1a. As an example, the first data line DL1a may be disposed on the same layer as a first fan-out portion FL1x of a first fan-out line FL1.

The first data line DL1a and the first fan-out portion FL1x may be provided integrally with each other. For instance, the first data line DL1a may correspond to a portion of the first fan-out portion FL1x extending in the display area DP-DA. The first data line DL1a may be electrically connected to a second data line DL2 after penetrating through a cover insulating layer CIL.

Figure 12A:
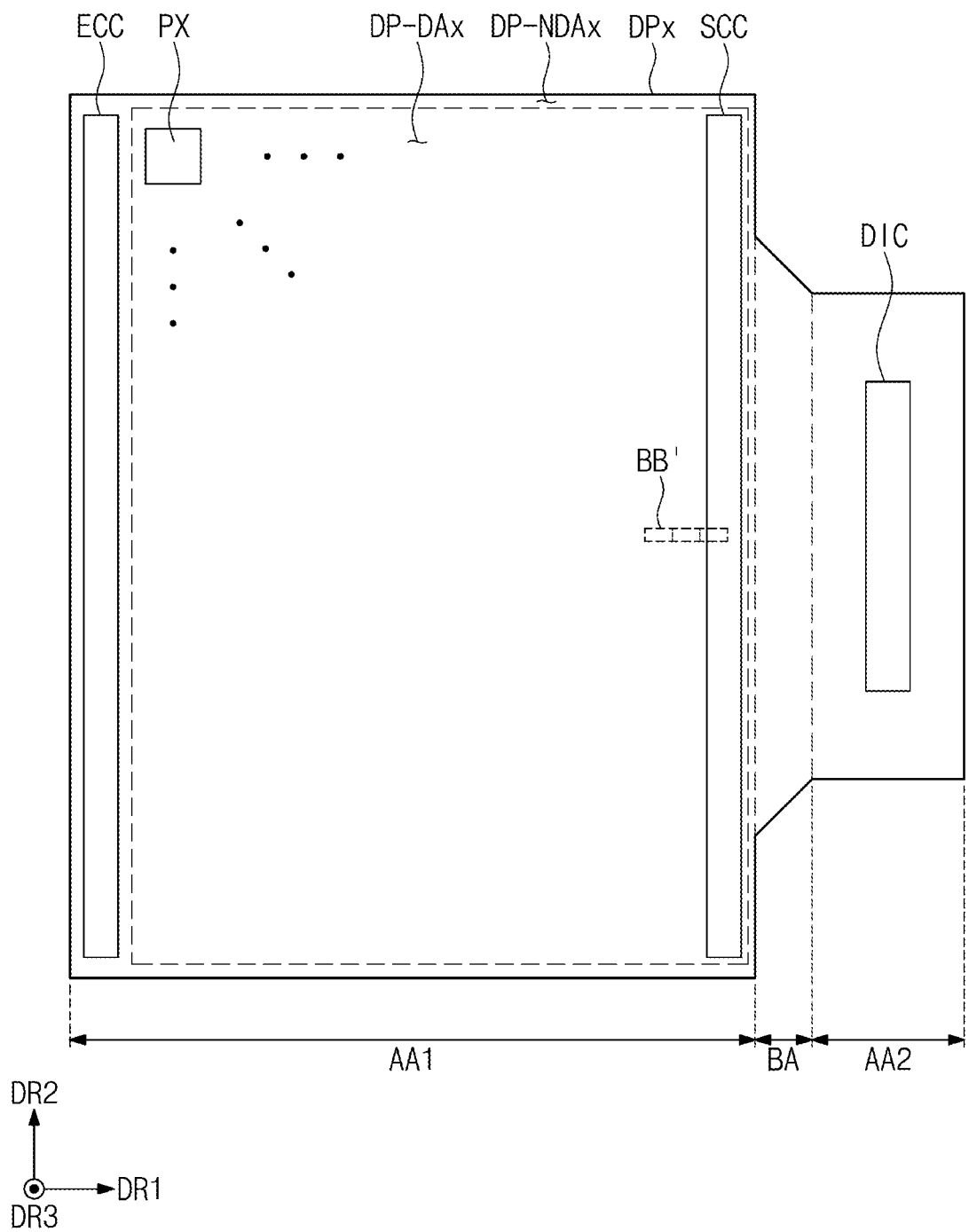
FIG. 12A is a plan view showing a display panel according to an embodiment.

FIG. 12A is a plan view showing a display panel DPx according to an embodiment.

Referring to FIG. 12A, the display panel DPx may include a display area DP-DAx and a non-display area DP-NDAx around the display area DP-DAx. The display area DP-DAx and the non-display area DP-NDAx may be distinguished from each other by whether a pixel PX is disposed or not. A data driving circuit and an emission driving circuit ECC may be disposed in the non-display area DP-NDAx. The data driving circuit may be a circuit implemented in a driving chip DIC. The scan driving circuit SCC may overlap a portion of the display area DP-DAx. For instance, as the display area DP-DAx extends to an area where the scan driving circuit SCC is disposed, a ratio of an area of the display area DP-DAx to a total area of the display panel DPx may increase.

Figure 12B:
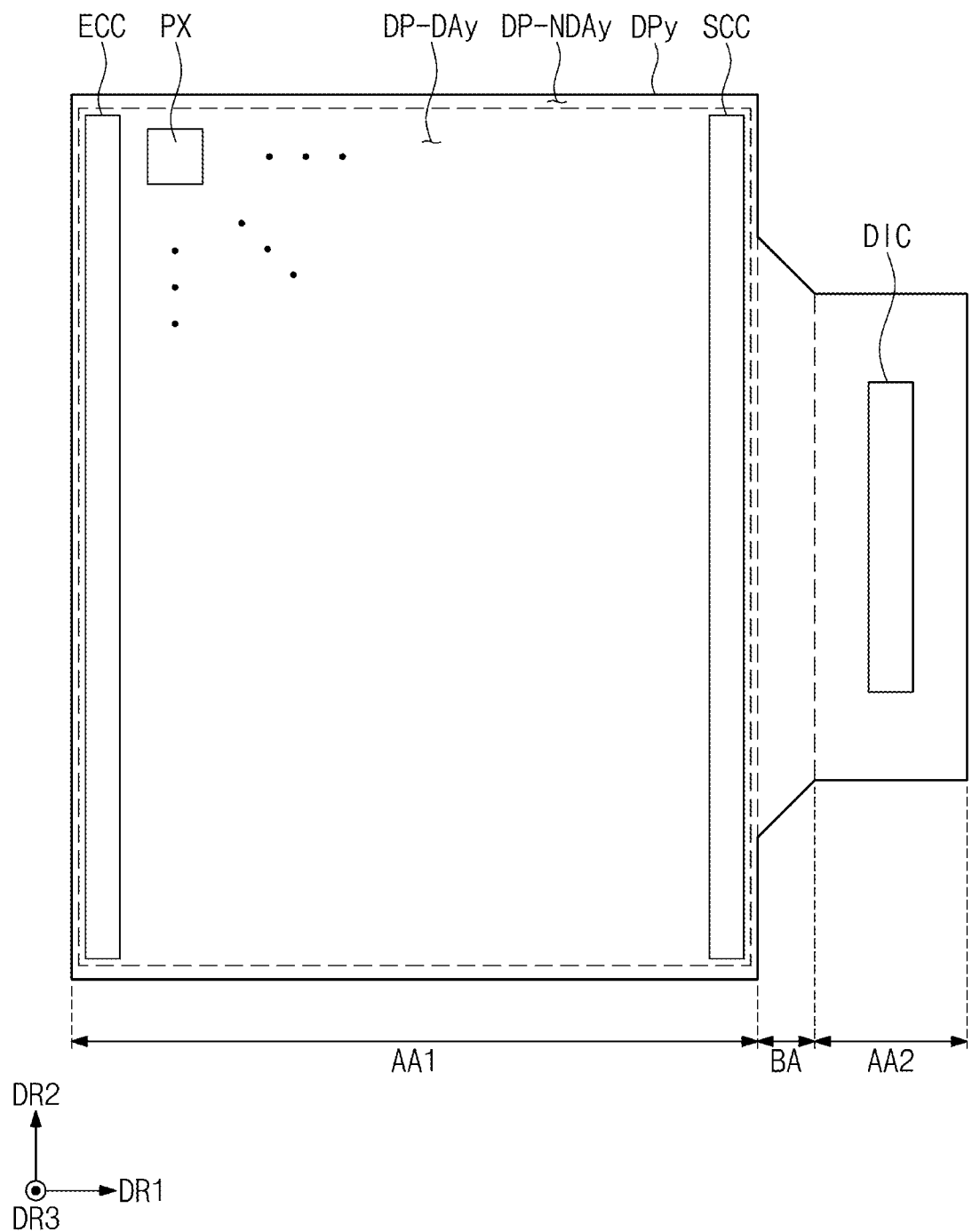
FIG. 12B is a plan view showing a display panel according to an embodiment.

FIG. 12B is a plan view showing a display panel DPy according to an embodiment.

Referring to FIG. 12B, the display panel DPy may include a display area DP-DAy and a non-display area DP-NDAy around the display area DP-DAy. The display area DP-DAy and the non-display area DP-NDAy may be distinguished from each other by whether a pixel PX is disposed or not.

A data driving circuit may be disposed in the non-display area DP-NDAy. The data driving circuit may be a circuit implemented in a driving chip DIC. A scan driving circuit SCC and an emission driving circuit ECC may overlap a portion of the display area DP-DAy. For instance, as the display area DP-DAy extends to an area where the scan driving circuit SCC and the emission driving circuit ECC are disposed, a ratio of an area of the display area DP-DAy to a total area of the display panel DPy may increase.

Figure 13:
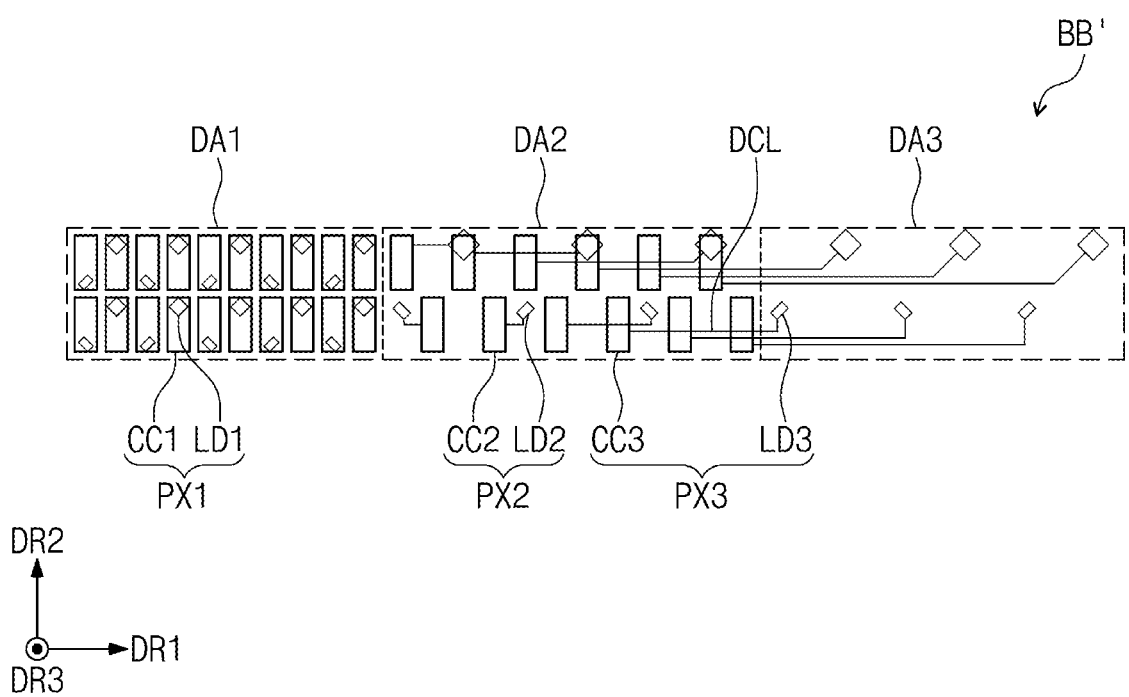
FIG. 13 is an enlarged plan view showing an area BB' of FIG. 12A according to an embodiment.
Figure 14:
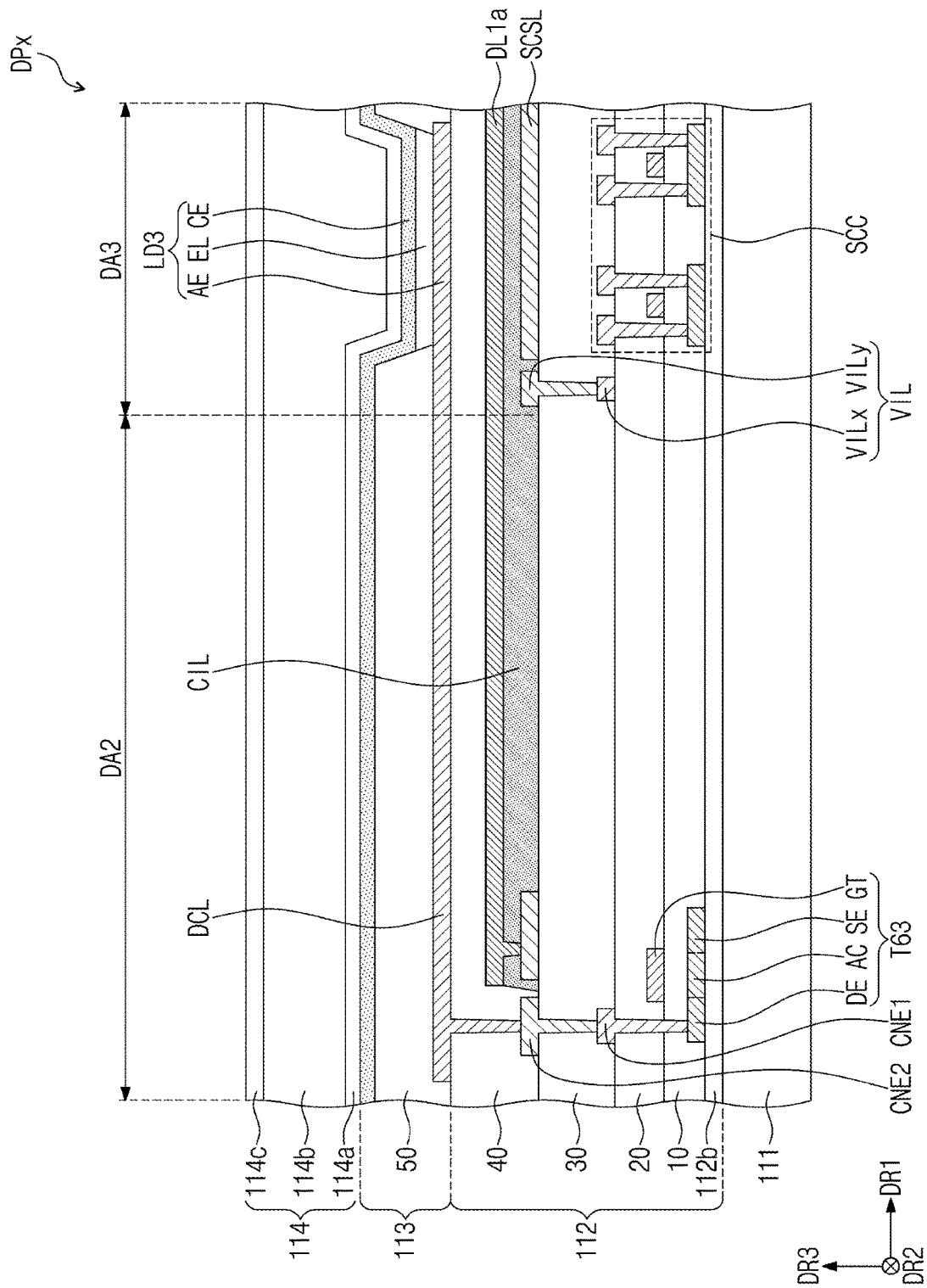
FIG. 14 is a cross-sectional view showing a display panel according to an embodiment.

FIG. 13 is an enlarged plan view showing an area BB' of FIG. 12A according to an embodiment. FIG. 14 is a cross-sectional view showing a display panel DPx according to an embodiment.

Referring to FIGS. 12A, 13, and 14, the display area DP-DAx may include a first display area DA1, a second display area DA2, and a third display area DA3. The third display area DA3 may overlap the scan driving circuit SCC, the second display area DA2 may be defined adjacent to the third display area DA3, and the first display area DA1 may be defined adjacent to the second display area DA2.

The pixels PX may include a plurality of first pixels PX1, a plurality of second pixels PX2, and a plurality of third pixels PX3. Each of the first pixels PX1 may include a first pixel circuit CC1 and a first light emitting element LD1 connected to the first pixel circuit CC1. The first pixels PX1 may be disposed in the first display area DA1. Each of the second pixels PX2 may include a second pixel circuit CC2 and a second light emitting element LD2 connected to the second pixel circuit CC2. Each of the third pixels PX3 may include a third pixel circuit CC3 and a third light emitting element LD3 connected to the third pixel circuit CC3.

Shapes of the first, second, and third light emitting elements LD1, LD2, and LD3 shown in FIG. 13 correspond to the shapes of the emission areas of the first, second, and third light emitting elements LD1, LD2, and LD3, respectively. For instance, each of the shapes of the first, second, and third light emitting elements LD1, LD2, and LD3 may correspond to the opening 50op (refer to FIG. 7) defined through the pixel definition layer 50 (refer to FIG. 7). Shapes of the first, second, and third pixel circuits CC1, CC2, and CC3 shown in FIG. 13 schematically show the regions in which the pixel circuit CC (refer to FIG. 4) is disposed.

The first pixel circuit CC1 and the first light emitting element LD1 may be disposed in the first display area DA1; the second pixel circuit CC2, the second light emitting element LD2, and the third pixel circuit CC3 may be disposed in the second display area DA2; and the third light emitting element LD3 may be disposed in the third display area DA3.

The first display area DA1 may have a resolution higher than a resolution of the second display area DA2 and a resolution of the third display area DA3. Not only the second pixel circuit CC2, which is included in the second light emitting element LD2 disposed in the second display area DA2, but also the third pixel circuit CC3, which is included in the third light emitting element LD3 disposed in the third display area DA3, may be disposed in the second display area DA2.

The first light emitting element LD1 may overlap the first pixel circuit CC1. The second light emitting element LD2 may be spaced apart from the second pixel circuit CC2, and the third light emitting element LD3 may be spaced apart from the third pixel circuit CC3. The second light emitting element LD2 may overlap another second pixel circuit that is not electrically connected to the second light emitting element LD2, the second light emitting element LD2 may overlap the third pixel circuit CC3, or the second light emitting element LD2 may not overlap other pixel circuits. The third light emitting element LD3 may overlap the scan driving circuit SCC.

FIG. 14 shows a sixth transistor T63 of the third pixel circuit CC3. The third light emitting element LD3 may be electrically connected to the sixth transistor T63 via a connection line DCL. The connection line DCL may be disposed on the same layer as a first electrode AE of the third light emitting element LD3 and may extend from the first electrode AE. The connection line DCL may be electrically connected to the sixth transistor T63 via a second connection electrode CNE2 and a first connection electrode CNE1.

According to an embodiment, the third light emitting element LD3 may be disposed on the scan driving circuit SCC. Accordingly, the image may be implemented in the area overlapping the scan driving circuit SCC. Accordingly, the display area of the electronic device ED (refer to FIG. 1A) may be expanded, and the bezel area or the non-display area of the electronic device ED (refer to FIG. 1A) may be reduced.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. An electronic device comprising:
    a display panel comprising a plurality of scan lines, a plurality of data lines, a plurality of fan-out lines, a plurality of pixels, a plurality of dummy lines, and a scan driving circuit configured to apply a scan signal to the plurality of scan lines; and
    a data driving circuit configured to apply a data signal to the plurality of data lines via the plurality of fan-out lines,
    wherein:
        at least some of the plurality of pixels overlap the plurality of fan-out lines;
        the plurality of data lines comprise a plurality of first data lines that each extend in a first direction;
        the plurality of dummy lines extend from the plurality of first data lines in the first direction and are spaced apart from the plurality of first data lines in the first direction and face the plurality of first data lines, respectively;
        a length of one first data line among the plurality of first data lines is greater than a length of another first data line among the plurality of first data lines;
        a length of one dummy line faced to the one first data line is less than a length of another dummy line faced to the another first data line;
        the data driving circuit and the scan driving circuit are spaced apart in the first direction; and the scan driving circuit is disposed between the plurality of dummy lines and the data driving circuit.

2. The electronic device of claim 1, wherein: the display panel comprises a display area on which an image is displayed and a non-display area defined adjacent to the display area; the plurality of pixels comprises: a first pixel including a first pixel circuit and a first light emitting element connected to the first pixel circuit; a second pixel including a second pixel circuit and a second light emitting element connected to the second pixel circuit; and a third pixel including a third pixel circuit and a third light emitting element connected to the third pixel circuit; the display area includes a first display area in which the first light emitting element is disposed, a second display area in which the second light emitting element is disposed, and a third display area in which the third light emitting element is disposed; and a resolution of the first display area is higher than a resolution of the third display area.

3. The electronic device of claim 2, wherein the scan driving circuit and the plurality of fan-out lines are disposed in the third display area.

4. The electronic device of claim 2, wherein the first pixel circuit is disposed in the first display area, and the second pixel circuit and the third pixel circuit are disposed in the second display area.

5. The electronic device of claim 2, wherein the third light emitting element overlaps the scan driving circuit, and the first pixel, the second pixel, and the third pixel circuit are spaced apart from the scan driving circuit.

6. The electronic device of claim 2, wherein the resolution of the first display area is higher than a resolution of the second display area.

7. The electronic device of claim 1, wherein:
the plurality of data lines further comprises a plurality of second data lines, the plurality of first data lines being electrically connected to the plurality of second data lines, respectively; and
the plurality of second data lines extend in a second direction crossing the first direction.

8. The electronic device of claim 7, wherein each of the plurality of fan-out lines includes a porting extending in a direction different from the first direction and the second direction.

9. The electronic device of claim 7, wherein:
the plurality of first data lines are electrically connected to the plurality of fan-out lines, respectively; and
the plurality of first data lines extends from the plurality of fan-out lines, respectively.

10. The electronic device of claim 7, wherein:
the plurality of first data lines are electrically connected to the plurality of fan-out lines, respectively; and
the plurality of first data lines are disposed on a layer different from a layer on which the plurality of fan-out lines are disposed.

11. The electronic device of claim 7, wherein:
a length of one fan-out line connected to the one first data line is less than a length of another fan-out line connected to the another first data line.

12. The electronic device of claim 7, wherein:
the plurality of scan lines extend in the first direction; and
the scan driving circuit and the data driving circuit are arranged in the first direction.

13. The electronic device of claim 7, wherein:
the display panel comprises a first panel area, a bending area, and a second panel area arranged along the first direction;
the scan driving circuit is disposed in the first panel area; and
the data driving circuit is provided in a driving chip form and is electrically connected to the display panel via the second panel area.

14. The electronic device as in claim 1, wherein the plurality of dummy lines are disposed on the same layer as the plurality of data lines.

15. An electronic device comprising:
a display panel in which a display area displaying an image and a non-display area adjacent to the display area are defined; and
a driving chip electrically connected to the display panel;
wherein:
the display panel comprises:
a plurality of pixels;
a plurality of scan lines electrically connected to the plurality of pixels;
a plurality of data lines electrically connected to the plurality of data lines;
a plurality of fan-out lines electrically connected to the plurality of data lines;
an auxiliary pattern configured to receive a common voltage, disposed in the display area, and having a mesh structure; and
a scan driving circuit providing scan signals to the plurality of scan lines, the plurality of data lines comprises a plurality of first data lines and a plurality of second data lines, the plurality of first data lines being electrically connected to the plurality of second data lines, respectively;
the plurality of first data lines extend in a first direction;
the plurality of second data lines extend in a second direction crossing the first direction;
each of the plurality of fan-out lines includes a portion extending in a direction different from the first direction and the second direction;
the plurality of pixels comprises:
a first pixel including a first pixel circuit and a first light emitting element connected to the first pixel circuit; and
a second pixel including a second pixel circuit and a second light emitting element connected to the second pixel circuit;
the second light emitting element overlaps at least one of the plurality of fan-out lines;
each of the first light emitting element and the second light emitting element comprises a first electrode, a light emitting layer disposed on the first electrode, and a second electrode disposed on the light emitting layer;
the second electrode is configured to receive the common voltage;
the mesh structure includes first lines extending in a first intersecting direction that is different from the first direction and the second direction, and second lines extending in a second intersecting direction that is different from the first direction and the second direction and intersects the first intersecting direction;
the driving chip and the scan driving circuit are spaced apart in the first direction; and
the scan driving circuit is disposed between the plurality of second data lines and the driving chip.

16. The electronic device of claim 15, wherein:
the second light emitting element overlaps the scan driving circuit.

17. The electronic device of claim 16, wherein each of the plurality of scan lines extends along the first direction.

18. The electronic device of claim 16, wherein a first area of the display panel in which the scan driving circuit is disposed and a second area of the display panel in which the driving chip is mounted are spaced apart from each other in the first direction.

19. The electronic device of claim 16, wherein the plurality of fan-out lines overlap the scan driving circuit.

* * * * *